US 6,625,877 B1

(12) United States Patent
Suhara et al.

(10) Patent No.: US 6,625,877 B1
(45) Date of Patent: *Sep. 30, 2003

(54) APPARATUS FOR SUPPORTING ELECTRIC-COMPONENT MOUNTER

(75) Inventors: Shinsuke Suhara, Kariya (JP); Takao Enomoto, Ninomiya-machi (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 314 days.

This patent is subject to a terminal disclaimer.

(21) Appl. No.: 09/689,705

(22) Filed: Oct. 13, 2000

Related U.S. Application Data

(63) Continuation of application No. 09/213,267, filed on Dec. 17, 1998, now Pat. No. 6,161,811.

(30) Foreign Application Priority Data

Jan. 27, 1998 (JP) ............................................... 10-14354

(51) Int. Cl.[7] .......................... B23P 19/00; B23P 21/00; F16M 1/00
(52) U.S. Cl. ............................. 29/740; 29/739; 29/705; 248/638
(58) Field of Search .......................... 29/739, 740, 705; 248/638, 636, 568, 566

(56) References Cited

U.S. PATENT DOCUMENTS

| 4,048,842 | A | | 9/1977 | Baratoff |
| 4,565,039 | A | | 1/1986 | Oguro et al. |
| 4,595,166 | A | | 6/1986 | Kurokawa |
| 4,662,133 | A | | 5/1987 | Kondo |
| 5,323,528 | A | | 6/1994 | Baker |
| 5,400,497 | A | | 3/1995 | Watanabe et al. |
| 5,765,800 | A | * | 6/1998 | Watanabe et al. ........... 248/550 |
| 5,816,559 | A | | 10/1998 | Fujimoto |
| 6,000,671 | A | | 12/1999 | Helms |
| 6,161,811 | A | * | 12/2000 | Suhara et al. ................ 248/638 |
| 6,237,126 | B1 | * | 5/2001 | Bonitz ............................ 716/4 |
| 6,475,833 | B2 | * | 11/2002 | Lin ............................. 438/121 |

FOREIGN PATENT DOCUMENTS

| DE | 195 32 863 | 3/1996 |
| GB | 2 173 426 | 10/1986 |
| JP | 61 16735 | 7/1986 |
| JP | A 9-237997 | 9/1997 |

* cited by examiner

Primary Examiner—Carl J. Arbes
Assistant Examiner—Tim Phan
(74) Attorney, Agent, or Firm—Oliff & Berridge, PLC

(57) ABSTRACT

An apparatus for supporting an electric-component mounter including a substrate supporting device which supports a circuit substrate, an electric-component supplying device which supplies a plurality of electric components to be mounted on the circuit substrate, a mounting device which receives the electric components from the electric-component supplying device and mounts the electric components on the circuit substrate supported by the substrate supporting device, and a base member which supports the substrate supporting device, the electric-component supplying device, and the mounting device, the apparatus including at least one elastic member which is provided between the base member and a surface of a floor which supports the base member, and at least one damper which damps vibration of the base member and the floor surface relative to each other, the vibration resulting from elastic deformation of the elastic member.

17 Claims, 8 Drawing Sheets

APPARATUS FOR SUPPORTING ELECTRIC-COMPONENT MOUNTER

"CROSS REFERENCE TO RELATED DOCUMENT

The present application is a continuation of application No. 09/213,267, now U.S. Pat. No. 6,161,811 which was filed on Dec. 17$^{th}$ 1998, and which is incorporated herein in its entirety."

BACKGROUND OF THE INVENTION

1. Field of the Invention

The present invention relates to an apparatus for supporting an electric-component mounter and particularly to the art of reducing the vibration of a floor which supports the electric-component mounter.

2. Related Art Statement

There is known an electric-component ("EC") mounter which includes a circuit-substrate ("CS") supporting device, an EC supplying device, and an EC mounting device. Those devices are supported on a common base member which is provided on the surface of a floor. The EC mounting device receives, from the EC supplying device, ECs (e.g., electronic components) as elements of an electric circuit (e.g., an electronic circuit), and mounts the ECs on a CS (e.g., a printed circuit board) supported by the CS supporting device. In this sort of EC mounter, at least one of the EC mounting device, the CS supporting device, and the EC supplying device includes a movable member which is movable for transferring the ECs supplied from the EC supplying device or mounting the ECs on the CS. Therefore, when the ECs are mounted on the CS, the movable member is a plan view of accelerated and decelerated and accordingly the base member is subjected to vibration. Since the base member is fixedly supported by the floor, almost all the vibrational energy is transmitted to the floor. Thus, not only the base member but also the floor are vibrated. The base member may be fixedly supported by the floor, in such a manner that the floor surface is covered with a leveling sheet formed of steel and the base member is placed on the leveling sheet via a plurality of leveling bolts. In this manner, the level at which the CS is conveyed, and the level at which the EC mounting device and the EC supplying device are provided, can be adjusted. In addition, the plurality of leveling bolts can be contacted with the floor surface at a substantially uniform pressure. Thus, the base member and the floor are connected to each other as if it were a unit. Thus, almost all the vibrational energy is transmitted to the floor.

If a rubber sheet is inserted between the leveling sheet and the floor, the vibrational energy which is transmitted to the floor can be more or less reduced by the elastic deformation of the rubber sheet. However, this reduction is not satisfactory. In a particular case, the frequency of the vibration exerted to the rubber sheet coincides with the natural frequency of the same. In this case, the rubber sheet resonates and the vibration is amplified.

SUMMARY OF THE INVENTION

It is therefore an object of the present invention to provide an electric-component-mounter supporting apparatus' which reduces the vibration of a floor resulting from the vibration of an electric-component mounter.

The present invention provides an electric-component-mounter supporting apparatus which has one or more of the technical features that are described below in respective paragraphs given parenthesized sequential numbers (1) to (15). Any technical feature which includes another technical feature shall do so by referring, at the beginning, to the parenthesized sequential number given to that feature. Thus, two or more of the following technical features may be combined, if appropriate. Each technical feature may be accompanied by a supplemental explanation, as needed. However, the following technical features and the appropriate combinations thereof are just examples to which the scope of the present invention is by no means limited.

(1) According to a first feature of the present invention, there is provided an apparatus for supporting an electric-component mounter including a substrate supporting device which supports a circuit substrate, an electric-component supplying device which supplies a plurality of electric components to be mounted on the circuit substrate, a mounting device which receives the electric components from the electric-component supplying device and mounts the electric components on the circuit substrate supported by the substrate supporting device, and a base member which supports the substrate supporting device, the electric-component supplying device, and the mounting device, the apparatus comprising at least one elastic member which is provided between the base member and a surface of a floor which supports the base member; and at least one damper which damps vibration of the base member and the floor surface relative to each other, the vibration resulting from elastic deformation of the elastic member. The mounting device may be; one which includes a plurality of electric-component ("EC") holders which are revolveable around a common axis; and an EC-holder positioning device which sequentially positions the EC holders at at least one predetermined operation position on the locus of revolution of the EC holders. The at least one operation position may include an EC-receive position where the mounting device receives the ECs from the EC supplying device. The EC-holder positioning device may be one which includes a plurality of rotary members which are rotatable about the above-indicated axis line, independent of each other, and which support the plurality of EC holders, respectively, at respective equal radial distances from the common axis; and a rotary-motion applying device which applies a rotary motion to each of the rotary members such that each of the rotary members is fully rotated by 360 degrees about the common axis while being stopped at least one time during its full rotation and having a predetermined time difference from each of its preceding and following rotary members. Otherwise, the EC-holder positioning device may be one which includes an intermittent-rotation body which is intermittently rotatable about the above-indicated common axis and which supports the plurality of EC holders at respective equal radial distances from the common axis; and a rotating device which intermittently rotates the intermittent-rotation body at the same angular pitch as that at which the EC holders are equiangularly spaced from each other about the common axis. The intermittent-rotation body which is rotated while supporting the EC holders may be replaced with a rotatable body which is rotatable by any desired angle in each of opposite directions. The mounting device may be one which includes at least one EC holder; and a movable member which supports the at least one EC holder and which is linearly movable in at least one of two directions perpendicular to each other on a plane. The mounting device may be one which is disclosed in U.S. patent application Ser. No. 08/977,662 assigned to the Assignee of the present application, i.e. one which includes a plurality of EC holders; the above-indicated, second EC-holder positioning device; and a movable member which supports the EC holders and the EC-holder positioning device and which is linearly movable in at least one of two directions perpendicular to each other on a plane. The substrate supporting device may be selected from various sorts of devices such as a device which supports and moves the circuit substrate, or a device which positions and supports the circuit substrate but does not move the same. The EC supplying device may be selected from various sorts of devices such as a movable device which stores the ECs and is movable, or a stationary device which stores the ECs but is not movable. Even if the EC mounter may vibrate when mounting the ECs on the circuit substrate, the elastic deformation of the elastic member permits the base member to move relative to the floor surface, so that the vibration of the EC mounter is prevented from being transmitted to the floor. In addition, the damper damps the relative vibration of the base member and the floor. Since the damper is provided between the base member and the floor, a portion of the vibration of the base member is damped by the damper whereas another portion of the vibration is transmitted to the floor via the damper. However, this portion is much smaller than the vibration which is transmitted to the floor in the case where neither the elastic member nor the damper is provided. Thus, the vibration of the floor is largely reduced, and the vibration of the base member is prevented from lasting for a long time, or being amplified because of resonance. The present apparatus can largely reduce the vibrational energy transmitted to the floor, than a conventional arrangement wherein a rubber sheet is inserted between a levelling sheet and a floor. That is, the present apparatus prevents the vibration of the floor, thereby preventing the vibration of other devices provided on the floor surface, the generation of noise, and the deterioration of life expectancy of the building in which the EC mounter is disposed. In addition, the present supporting apparatus damps the vibration of the base member, thereby reducing the amplitude of the vibration of the EC mounter. Therefore, for example, the substrate supporting device can reliably receive and pass the circuit substrate from and to the other devices, because the substrate supporting device is not so largely dislocated relative to the other devices. The elastic member may be provided by a coil spring that is elastically deformable in a direction parallel to its center axis line and directions perpendicular to the center axis line. In the case where the coil spring is disposed such that the center axis line of the coil spring extends perpendicularly to the floor surface, the coil spring can permit the relative vibration of the base member and the floor in all directions.

(2) According to a second feature of the present invention that includes the first feature (1), the mounter supporting apparatus further comprises at least one upper member which is fixed to the base member; and at least one lower member which is provided on the floor surface, the elastic member and the damper being provided between the upper and lower members. The elastic member may be provided between a first pair of upper and lower members, and the damper may be provided between a different, second pair of upper and lower members. According to the second feature, however, the elastic member and the damper are provided between the common pair of upper and lower members, so that the elastic member and the damper are connected to each other. Consequently the elastic deformation of the elastic member is effectively reduced by the damper, so that the relative vibration of the base member and the floor is effectively damped. In addition, according to this feature, the supporting apparatus including the elastic member and the damper can be produced and handled as a unit, which facilitates disposing the EC mounter on the floor. Though the upper member needs to be substantially fixed to the base member such that the upper member is not movable relative to the same, it need not be fixed using a fixing member or device such as bolts.

(3) According to a third feature of the present invention that includes the first or second feature (1) or (2), the mounting device receives, at a predetermined component-receive position, the electric components from the electric-component supplying device, and the electric-component supplying device comprises a movable electric-component supplying device which includes a movable table which is movable along a straight line passing through the component-receive position; and a plurality of component supplying units which are provided on the movable table and each of which is selectively positioned at the component-receive position by the movement of the movable table, and the damper damps the relative vibration of the base member and the floor surface in at least a direction parallel to the straight line. Each of the component supplying units may be one which includes an EC-supply portion and a tape feeding device which feeds an EC carrier tape including an EC accommodating tape accommodating the ECs, such that the ECs are fed one by one to the EC-supply portion; or otherwise one which includes an EC-supply portion and utilizes vibration, inclination, air flow, one or more conveyor belts, or the combination of two or more of them, for feeding the ECs in an array, such that the ECs are fed one by one to the EC-supply portion. In either case, each component supplying unit may further include an EC storing device which stores the ECs or the EC carrier tape; and a main frame. The main frame may, nor may not, support both the EC feeding device and the EC storing device. In the case where the main frame supports both the EC feeding device and the EC storing device, the main frame is attached to the movable table, whereby both the EC feeding device and the EC storing device are moved with the movable table. In the case where the main frame supports the EC feeding device but does not support the EC storing device, the main frame is attached to the movable table, whereby only the EC feeding device is moved with the movable table. In the latter case, the respective EC storing devices of the component supplying units may be provided on another movable table, or may be provided on a stationary table, i.e., may be fixed in position. Since the movable table on which the plurality of component supplying units are provided has a great mass, the base member is subjected, when the movement of the table is started or ended, to a great vibrational force in a direction parallel to the direction of movement of the table, so that the base member is vibrated in that direction. According to this feature, the damper effectively damps the vibration of the base member produced in the very direction. The linearly movable table may be replaced with a table which is movable along a line other than the straight line, for example, a circle, a circular arc (i.e. a part circle), a curve other than the circular arc, or a single line obtained by combining two or more of them. In the case of the circle, the linearly movable table may be replaced with a circular (i.e., full-circular) table which is rotatable about an axis line. In the case of the circular arc, the linearly movable table may be replaced with a sectorial table which is rotatable about an axis line. Each of the circular and sectorial tables can be said as a rotary table which is rotatable about an axis line. Also in the case where the linearly movable table is replaced with the rotary table, the elastic deformation of the elastic member permits the relative vibration of the base member and the floor and the damper damps the relative vibration. However, generally, the vibration of the base member produced in the case where the linearly movable table is started and stopped is much greater than that produced in the case where the rotary table is started and stopped. Thus, the present supporting apparatus is more advantageous when used with the linearly movable table than when used with the rotary table.

(4) According to a fourth feature of the present invention that includes the third feature (3), the damper damps the relative vibration of the base member and the floor surface in all directions on at least a vertical plane parallel to the straight line. As described above, when the linearly movable table is started and stopped, the base member is subjected to a great vibrational force in a direction parallel to the direction of movement of the table. Generally, the level or height position at which the vibrational force is applied to the base member is different from that at which the base member is supported by the mounter supporting apparatus. Therefore, the base member is subjected to a moment and accordingly a rotational vibration. Consequently a portion of the base member that is supported by the supporting apparatus is subjected to the vibration including all components corresponding to all directions on a vertical plane parallel to the direction of movement of the table. According to this feature, the damper damps the vibration produced in all the directions on the vertical plane. Thus, the present supporting apparatus effectively damps the vibration of the base member. In the case where the damper can additionally damp the vibration produced in a direction perpendicular to the direction of movement of the table on a plane parallel to the floor surface, the present apparatus can more effectively reduce the vibration of the base member.

(5) According to a fifth feature of the present invention that includes any one of the first to fourth features (1) to (4), the damper comprises an adjustable damper which has an adjustable vibration damping characteristic. The amplitude of the vibration of the floor resulting from the vibration transmitted thereto from the base member, changes depending upon the conditions of the floor, such as its rigidity, mass, and vibration damping characteristic. According to the fifth feature, the mounter supporting apparatus includes the adjustable damper whose vibration damping characteristic is adjustable. For example, when the EC mounter is disposed on the floor, the vibration damping characteristic of the damper is adjustable depending upon the conditions of the floor, so that the amplitude of vibration of the floor is minimized. The amplitude and frequency of the vibration transmitted from the base member to the floor change depending upon the conditions of the EC mounter, such as its mass and the speed of movement of its movable member or members. The mass of the movable EC supplying device as a whole changes as the number of the component supplying units mounted on the movable table changes, or as the number of the ECs stored in each of the supplying units changes. Also, the speed of operation of the EC mounter changes. However, the vibration damping characteristic of the damper can be adjusted depending upon those changes, so that the amplitude of vibration of the floor is not increased.

(6) According to a sixth feature of the present invention that includes the fifth feature (5), the adjustable damper comprises a movable member which is movable as a unit with the base member; a stationary member which is substantially immovable relative to the floor surface; a friction member which is held by one of the movable and stationary members such that the friction member is movable toward, and away from, the other of the movable and stationary members and is frictionally contactable with the other of the movable and stationary members; and a pressing device which is provided between the friction member and the one of the movable and stationary members and which presses, with an adjustable pressing force, the friction member against the other of the movable and stationary members. Since the friction member is pressed against the other of the movable and stationary members, friction occurs between the friction member and the other member, so that the vibrational energy is transformed into thermal energy. Consequently the vibration is damped. The vibration damping characteristic of the damper can be adjusted by adjusting the pressing force of the pressing device applied to the friction member.

(7) According to a seventh feature of the present invention that includes the sixth feature (6), the pressing device comprises a fluid-pressure-operated cylinder device which includes a cylinder and a piston and which is fixed to the one of the movable and stationary members, the piston pressing the friction member against the other of the movable and stationary members. The fluid-pressure-operated cylinder device may be an air- or liquid-pressure-operated cylinder device. In either case, the pressing force can be adjusted by adjusting the pressure of the fluid. The friction member may be fixed to the piston, or may be supported by the one of the movable and stationary members such that the friction member is movable in a direction parallel to the direction of movement of the piston.

(8) According to an eighth feature of the present invention that includes any one of the first to seventh features (1) to (7), the damper comprises an unadjustable damper which has an unadjustable vibration damping characteristic. Even the unadjustable damper whose vibration damping characteristic is not adjustable can damp the relative vibration of the base member and the floor, thereby preventing the amplification of the vibration of the EC mounter and the resonance of the same. In a particular case where it is not needed to adjust all the vibration damping capability of the present mounter supporting apparatus, it is possible to employ both the adjustable damper or dampers and the unadjustable damper or dampers, which contributes to reducing the production cost of the present apparatus.

(9) According to a ninth feature of the present invention that includes any one of the first to eighth features (1) to (8), the mounter supporting apparatus further comprises at least one inclination adjusting device which is provided between the base member and the floor surface and which adjusts an inclination of the base member relative to the floor surface. Since the EC mounter is supported on the floor via the elastic member such that the base member and the floor can be vibrated relative to each other, the base member is easily inclined relative to the floor surface. For example, it is difficult to produce a plurality of elastic members which can support, in the state of being elastically deformed, the base member such that the base member is not inclined relative to the floor surface. Thus, the base member is easily inclined because of the production-related errors of the elastic members. In addition, the weight of the EC supplying device as a whole changes as the number of the component supplying units employed changes or as the number of ECs stored in each of the component supplying units changes. This change also causes the inclination of the base member. The inclination adjusting device easily adjusts the inclination of the base member and keeps the base member parallel to the floor surface. Thus, the EC mounter does not fail to receive or pass the circuit substrate from or to its peripheral devices.

(10) According to a tenth feature of the present invention that includes the ninth feature (9), the inclination adjusting device comprises a gas spring which comprises a gas chamber and a compressible gas enclosed in the gas chamber; and a leveling valve device which adjusts a pressure of the compressible gas enclosed in the gas chamber of the gas spring and thereby adjusts the inclination of the base member relative to the floor surface. The gas may be air or nitrogen gas. The leveling valve device may be one which adjusts the gas pressure of the gas spring so as to keep a predetermined height of the gas spring.

(11) According to an eleventh feature of the present invention that includes the tenth feature (10), the leveling valve device comprises a mechanical valve device which is provided between the base member and the floor surface and which adjusts the inclination of the base member relative to the floor surface, based on movement of the base member and the floor surface relative to each other in a direction intersecting a horizontal plane. The leveling valve device may include a solenoid-operated switch valve device. However, this switch valve device is selectively switched between its gas-supply position where the valve permits a pressurized gas to be supplied from a gas source to the gas spring and its gas-relieve position where the valve device permits the gas to be relieved from the gas spring into the atmosphere. Thus, the solenoid-operated switch valve device cannot finely control or change the gas pressure of the gas spring. In contrast, the mechanical valve device can be gradually switched between its gas-supply position and its gas-relieve position, and can finely change the gas pressure of the gas spring. Thus, the mechanical valve device can accurately adjust the inclination of the base member.

(12) According to a twelfth feature of the present invention that includes any one of the first to eleventh features (1) to (11), the mounter supporting apparatus comprises a plurality of the elastic members each of which is provided between the base member and the floor surface; a plurality of the dampers each of which damps the vibration of the base member and the floor surface relative to each other; a plurality of upper members each of which is fixed to the base member; and a plurality of lower members each of which is provided on the floor surface, at least one first elastic member of the plurality of elastic members and at least one first damper of the plurality of dampers being provided between at least one first upper member of the plurality of upper members and at least one first lower member of the plurality of lower members, so as to provide a first supporting unit, at least one second elastic member of the plurality of elastic members and at least one second damper of the plurality of dampers being provided between at least one second upper member of the plurality of upper members and at least one second lower member of the plurality of lower members, so as to provide a second supporting unit, the first and second supporting units cooperating with each other to support the base member, at respective locations which are distant from each other in a horizontal direction. The horizontal direction is not limited to a specific direction. The two supporting units can stably support the base member relative to the floor surface. The respective dampers of the two supporting units may be either adjustable ones or unadjustable ones.

(13) According to a thirteenth feature of the present invention that includes the twelfth feature (12), the at least one first upper member comprises an elongate first upper member, the at least one first lower member comprises an elongate first lower member, the at least one second upper member comprises an elongate second upper member, and the at least one second lower member comprises an elongate second lower member, and the first supporting unit comprises two first elastic members one of which is provided at one of lengthwise opposite end portions of the elongate first upper member and one of lengthwise opposite end portions of the elongate first lower member and the other of which is provided at the respective other end portions of the elongate first upper and lower members, and two first dampers one of which is provided at the respective one end portions of the elongate first upper and lower members, and the other of which is provided at the respective other end portions of the elongate first upper and lower members, and the second supporting unit comprises two second elastic members one of which is provided at one of lengthwise opposite end portions of the elongate second upper member and one of lengthwise opposite end portions of the elongate second lower member and the other of which is provided at the respective other end portions of the elongate second upper and lower members, and two second dampers one of which is provided at the respective one end portions of the elongate second upper and lower members and, the other of which is provided at the respective other end portions of the elongate second upper and lower members. According to this feature, at least four elastic members and at least four dampers are provided at respective locations corresponding to the four corners of the base member. Thus, the supporting units can more stably support the base member relative to the floor surface, while permitting the base member to move relative to the floor surface.

(14) According to a fourteenth feature of the present invention that includes the twelfth or thirteenth feature (12) or (13), the electric-component supplying device comprises a component-supply table and a plurality of component supplying units which are provided on the component-supply table such that respective component-supply portions of the component supplying units are arranged along a straight line, and the mounter supporting apparatus further comprises an inclination adjusting device which is provided between the floor surface and a portion of the base member that supports the component-supply table, and which adjusts an inclination of the base member relative to the floor surface. The number of the component supplying units provided on the component-supply table may be changed depending upon, e.g., the sort of the circuit substrate used, and the number of ECs stored in each of the component supplying units decreases as the ECs are mounted one by one on the substrate. Thus, the weight of the EC supplying device changes. Therefore, the base member is inclined relative to the floor surface in a direction perpendicular to the direction in which the respective component-supply portions of the component supplying units are arranged. However, the inclination adjusting device can keep the base member substantially parallel to the floor surface.

(15) According to a fifteenth feature of the present invention that includes the fourteenth feature (14), the mounting device receives, at a predetermined component-receive position, the electric components from the electric-component supplying device, the straight line along which the respective component-supply portions of the component supplying units are arranged passes through the component-receive position, and the electric-component supplying device comprises a movable electric-component supplying device which comprises the component-supply table comprising a movable table which is movable along the straight line, and the component supplying units having the respective component-supply portions each of which is selectively positioned at the component-receive position by the movement of the movable table, and the first and second supporting units are provided at the respective locations which are distant from each other in the horizontal direction parallel to the straight line, and each of the first and second dampers of the first and second supporting units has a function of damping the relative vibration of the base member and the floor surface in all directions on at least a vertical plane parallel to the straight line. Since the movable table has a great mass, the base member is subjected to a great vibrational force in a direction parallel to the straight line passing through the component-receive position. However, according to this feature, the two supporting units are provided at the respective locations distant from each other in that direction. In addition, the dampers damp the relative vibration of the base member and the floor surface in all directions on the vertical plane parallel to the direction of movement of the table. Thus, the vibration which is transmitted to the floor is reduced, and the vibration of the EC mounter is reduced. Irrespective of where the movable table is started or stopped within its movement area or irrespective of whether the table is moved forward or backward along the straight line, the two supporting units permit the relative vibration of the base member and the floor surface, while damping the same. As the movable table is moved, the balance of respective loads applied to respective portions of the base member that are distant from each other in the direction of movement of the table changes, so that the base member is inclined. Therefore, it is preferred that one or more inclination adjusting devices be provided for adjusting the inclination of the base member in that direction. For example, two inclination adjusting devices each of which adjusts the distance between the base member and the floor surface are provided at respective locations which are distant from each other in the direction of movement of the table. Each of the two inclination adjusting devices may include the above-described combination of the gas spring and the leveling valve device.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
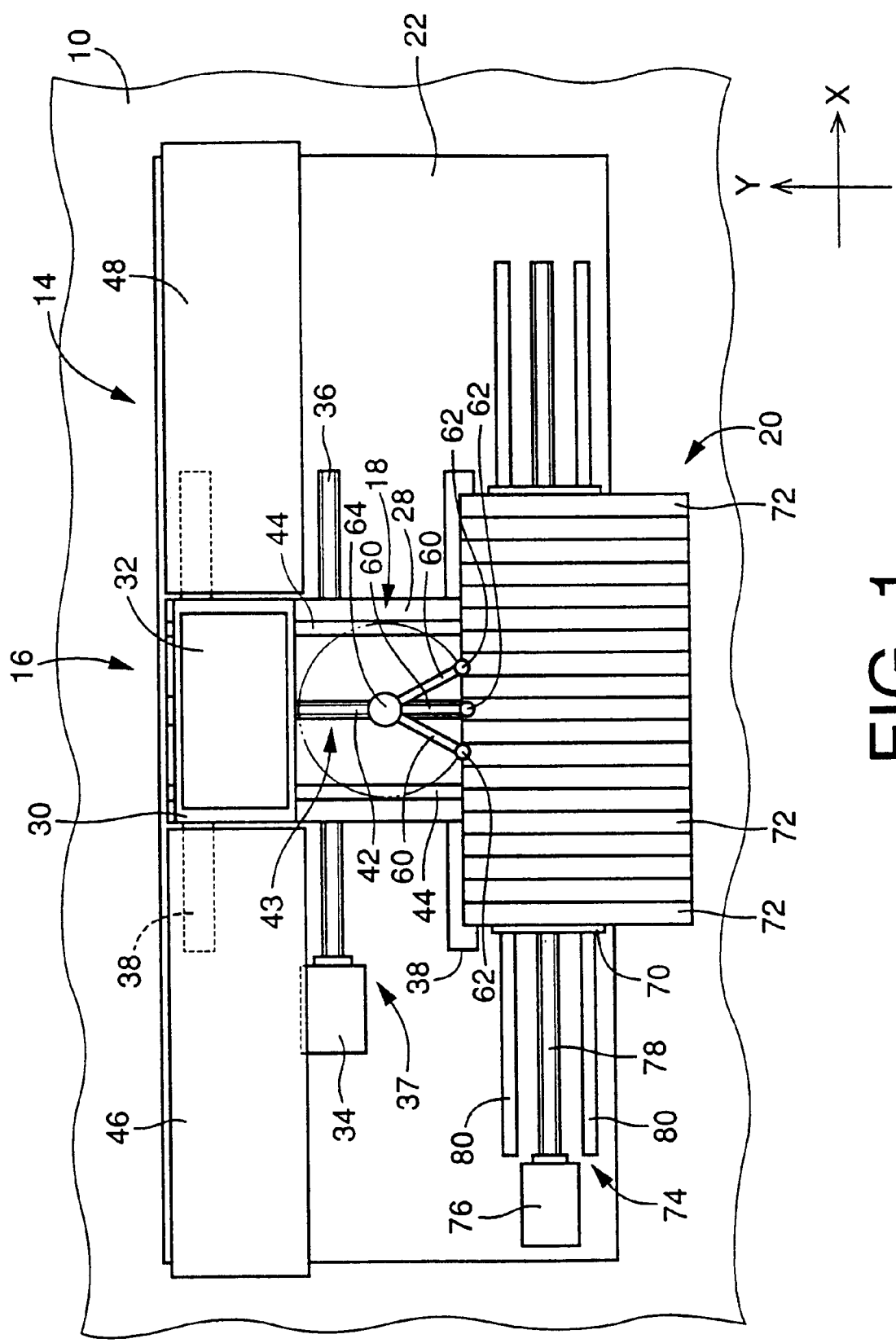
FIG. 1 is a schematic plan view of an electric-component ("EC") mounter which is supported by an EC-mounter supporting apparatus to which the present invention is applied.

Hereinafter, there will be described an electric-component ("EC") mounter supporting apparatus 12 (FIG. 2) to which the present invention is applied. The EC-mounter supporting apparatus 12 supports an EC mounter 14, on a horizontal surface 10 of a floor. The EC mounter 14 includes a printed-circuit-board ("PCB") supporting device 16, a mounting device 18, and a movable EC supplying device 20, and a base member 22 which supports the three devices 16, 18, 20.

The PCB supporting device 16 includes an X-axis table 28 which is movable in an X-axis direction indicated at an arrow in FIG. 1; and a Y-axis table 30 which is provided on the X-axis table 28 and which is movable in a Y-axis direction, indicated at an arrow in FIG. 1, perpendicular to the X-axis direction on a horizontal plane. On the Y-axis table 30, there is provided a board holding device (not shown) which positions and holds a PCB 32 as a circuit substrate.

The X-axis table 28 is moved in the X-axis direction by an X-axis-table moving device 37, while being guided by a pair of straight guide rails 38 as guide members. The X-axis-table moving device 37 includes an X-axis servomotor 34 as a drive source, and a motion converting device which includes a feed screw 36 and a nut (not shown) and converts the rotation of the X-axis servomotor 34 into a linear motion of the X-axis table 28. The Y-axis table 30 is moved in the Y-axis direction by a Y-axis-table moving device 43, while being guided by a pair of straight guide rails 44 as guide members. The Y-axis-table moving device 43 includes a Y-axis servomotor (not shown) as a drive source, and a motion converting device which includes a feed screw 42 and a nut (not shown) and converts the rotation of the Y-axis servomotor into a linear motion of the Y-axis table 30.

The PCB 32 is carried in onto the PCB supporting device 16 by a PCB carry-in conveyor 46, and carried out from the device 16 by a PCB carry-out conveyor 48. The two conveyors 46, 48 are provided on the floor surface 10, and are connected to each other by a connection member (not shown). Each of the two conveyors 46, 48 conveys the PCB 32 in the X-axis direction. The board holding device provided on the Y-axis table 30 is vertically movable between its upper stroke end position where the holding device receives the PCB 32 from the PCB carry-in conveyor 46 and passes the same 32 to the PCB carry-out conveyor 48, and its lower stroke end position where the holding device is moved with the X-axis table 28 and the Y-axis table 30 so that a number of EC-mount places on the PCB 32 are sequentially positioned at a predetermined EC-mount position.

The mounting device 18 has the same construction as that of a mounting device disclosed in Japanese Patent Application laid open for public inspection under Publication No. 9(1997)-237997 corresponding to U.S. patent application Ser. No. 08/769,700. Therefore, the mounting device 18 will be described briefly. The mounting device 18 includes a main frame (not shown) which is provided on the base member 22; a plurality of rotary plates 60 as rotary members (in the present embodiment, twelve rotary plates 60 are employed); a rotary-plate rotating device as a rotary-motion applying device which applies a rotary motion to each of the rotary plates; and a plurality of EC holding heads 62 which are supported by the plurality of rotary plates 60, respectively (in the present embodiment, twelve EC holding heads 62 are employed). The rotary plates 60 are attached to a vertical axis member 64 (FIG. 1) supported by the main frame, such that the rotary plates 60 are rotated about the axis member 64, independent of each other. The EC holding heads 62 are supported by the rotary plates 60, respectively, such that the holding heads 62 are vertically movable relative to the corresponding rotary plates 60. Each EC holding head 62 as a sort of EC holder includes an EC sucker (not shown) which sucks and holds an EC by applying a negative air pressure thereto.

The rotary-plate rotating device include twelve rollers (not shown) as cam followers which are provided on the twelve rotary plates 60, respectively; and four globoidal cams as rotary-motion applying cams each of which sequentially engages the twelve rollers and thereby moves or rotates each of the twelve rotary plates 60. The four globoidal cams are rotated in synchronism with one another by a cam drive device including a servomotor as its drive source, so that the twelve rotary plates 60 are rotated independent of each other and the twelve EC holding heads 62 are revolved around the axis member 64. Three rotary plates 60 of the twelve rotary plates 60 are simultaneously stopped at an EC-suck position as an EC-receive position, an EC-image-take position, and the EC-mount position, respectively. At the EC-suck position, a first EC holding head 62 sucks and holds an EC; at the EC-image-take position, an image of an EC held by a second EC holding head 62 is taken; and at the EC-mount position, a third EC holding head 62 mounts an EC on the PCB 32. While the three rotary plates 60 are stopped, the other, nine rotary plates 60 are rotated about the axis member 64. Since each of the EC holding heads 62 can reach each of the EC-suck position, the EC-image-take position, and the EC-mount position, at a short time interval or pitch, the EC mounting device 18 enjoys a high EC-mount efficiency.

The EC-suck position and the EC-mount position are distant from each other by 180 degrees, and are aligned with each other in the Y-axis direction. The movable EC supplying device 20 and the PCB supporting device 16 are provided at respective positions corresponding to the EC-suck and EC-mount positions, respectively. At each of those positions, a head elevating and lowering device is provided, for elevating and lowering each EC holding head 62 being positioned at the EC-suck or EC-mount position, so that the each EC holding head 62 holds or mounts an EC. At the EC-image-take position, there is provided a CCD (charge coupled device) camera (not shown) as an image taking device. The EC sucker of each of the EC holding heads 62 is rotatable about its axis line, and is rotated about its axis line by an EC-sucker rotating device (not shown) provided on the corresponding one of the rotary plates 60. Thus, a rotation-position error of the EC sucker can be corrected. A portion of the PCB supporting device 16 is located below the mounting device 18, and another portion of the same 16 is located below respective upper portions of the PCB carry-in and carry-out conveyors 46, 48.

As shown in FIG. 1, the movable EC supplying device 20 includes a movable table 70, and a plurality of EC supplying units 72 each of which is detachably attached to the movable table 70. Each of the EC supplying units 72 supplies an EC carrier tape which carries a plurality of ECs and which is wound around a tape reel. The tape reel is rotatably supported by a tape storing device as an EC storing device, and the tape storing device is provided on a main frame of the each EC supplying unit 72. The carrier tape drawn from the tape reel is fed to a tape feeding device as an EC feeding device provided on the main frame. Thus, The tape feeding device feeds the ECs one by one to an EC-supply portion of the each EC supplying unit.

The plurality of EC supplying units 72 are detachably attached to the movable table 70 such that the respective EC-supply portions of the units 72 are arranged along a straight line parallel to the X-axis direction. This straight line passes through the EC-suck position of the mounting device 18, and the movable table 70 is moved by a movable-table moving device 74 in the X-axis direction, that is, along the straight line passing through the EC-suck position. Hereinafter, the direction of movement of the movable table 70 will be referred to as the "table-movement" direction. The table-movement direction is parallel to the direction in which the PCB carry-in and carry-out conveyors 46, 48 conveys the PCB 32.

The movable-table moving device 74 includes a table-moving servomotor 76 as a drive source, and a motion converting device which includes a feed screw 78 and a nut (not shown) and converts the rotation of the servomotor 76 into a linear movement of the movable table 70. The movable table 70 is moved by the moving device 74 while being guided by a pair of straight guide rails 80 as guide members. Thus, each of the respective EC-supply portions of the EC supplying units 72 is selectively positioned at the EC-suck position of the mounting device 18. The positioning of each EC-supply portion at the EC-suck position means the positioning of the corresponding EC supplying unit 72 at the EC-suck position. The EC-suck position of the mounting device 18 coincides with an EC-supply position of the movable EC supplying device 20. The EC-supply portion of one EC supplying unit 72 being positioned at the EC-supply position is positioned below one EC holding head 62 being positioned at the EC-suck position. Each of the servomotors that are employed as the X-axis-table drive motor 34, the Y-axis-table drive motor, the movable-table moving motor 76, and the cam drive motor of the rotary-plate rotating device, is an electric rotary motor as a sort of electric motor that is precisely controllable with respect to its rotation angle and rotation speed. Those servomotors may be replaced with stepper motors.

Figure 2:
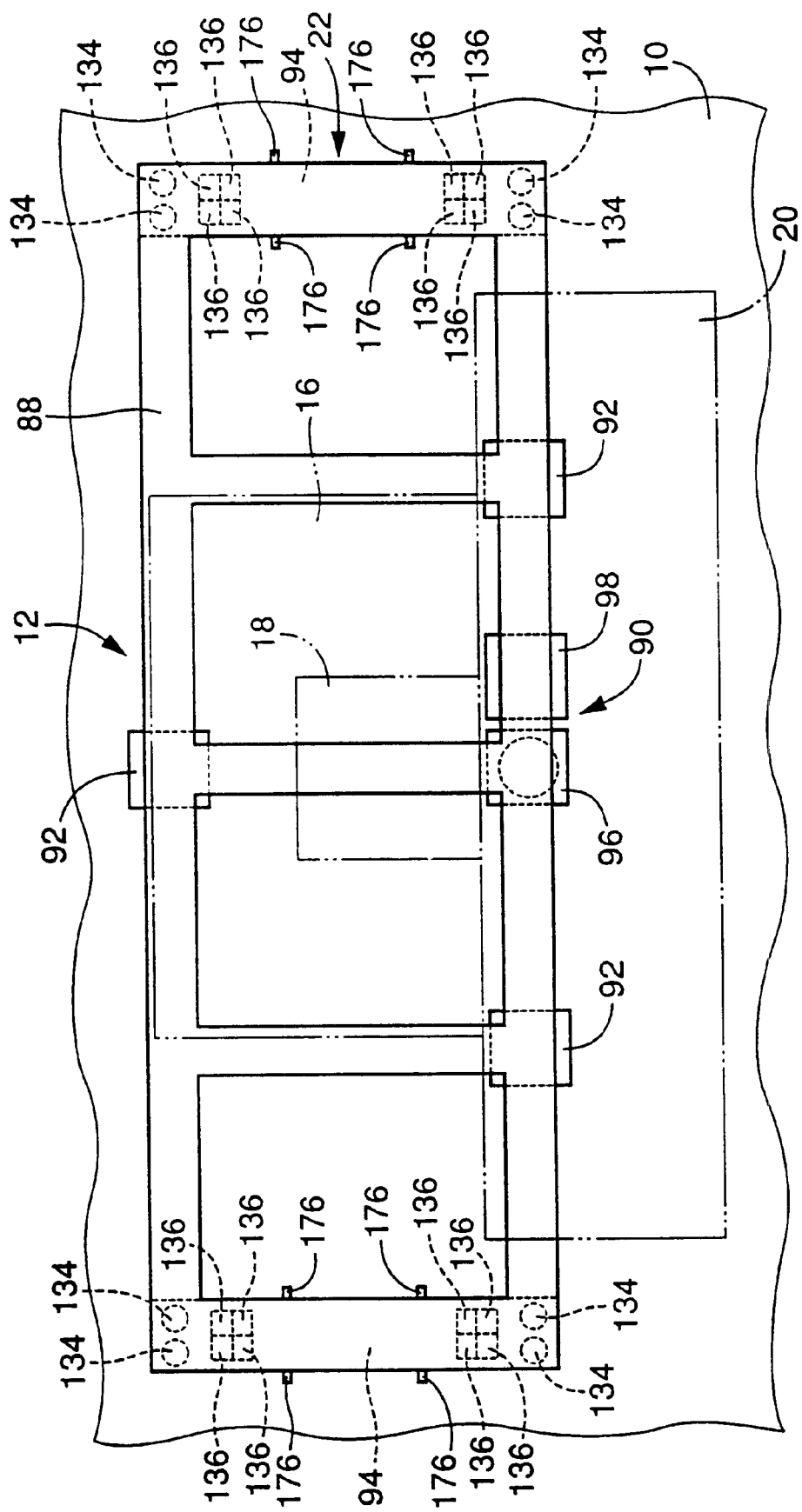
FIG. 2 is a plan view of the EC-mounter supporting apparatus of FIG. 1 and a frame as a base member of the EC mounter.
Figure 3:
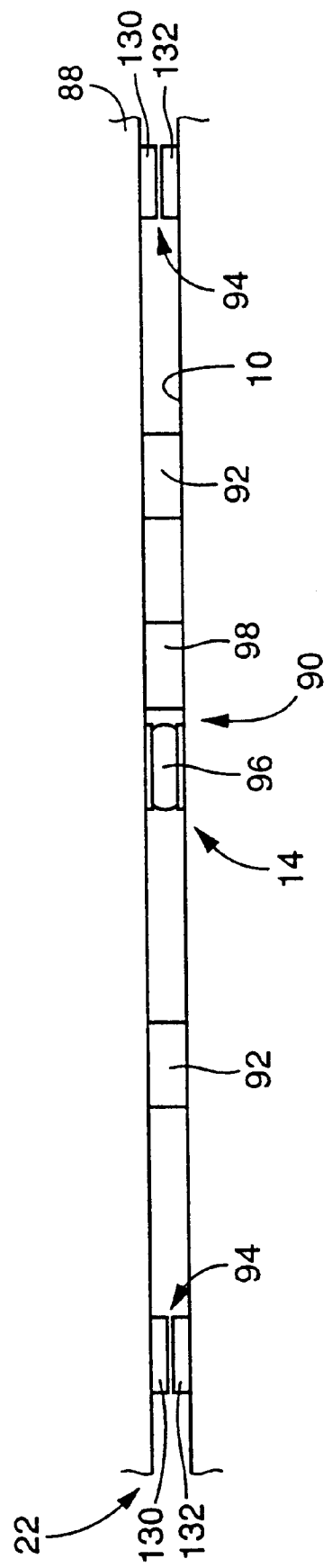
FIG. 3 is a front elevation view of the EC-mounter supporting apparatus of FIG. 1.

As shown in FIGS. 2 and 3, the EC-mounter supporting apparatus 12 is provided between the floor surface 10 and a frame 88 as the base member 22 of the EC mounter 14, and includes an inclination adjusting device 90, three spring units 92, and two supporting units 94. It is assumed that the floor surface 10 is horizontal. However, in some cases, the floor surface 10 may not be horizontal for some reason. In such cases, one or more adjust members is or are placed, on the floor surface 10, at one or more of respective locations where the inclination adjusting device 90, the spring units 92, and the supporting units 94 are to be located, so that the EC-mounter supporting apparatus 12 may be provided on a horizontal plane defined by the one or more adjust members and/or the floor surface 10.

The inclination adjusting device 90 includes an air spring 96 as a sort of gas spring, and a mechanical valve device 98. The adjusting device 90 is provided between the floor surface 10 and a portion of the frame 88 that supports the movable table 70. More specifically, this portion is a middle portion of a table-movement area in which the movable table 70 is moved, as seen in the table-movement direction (i.e., the X-axis direction), and is adjacent to the mounting device 18 as seen in a direction (i.e., the Y-axis direction) perpendicular to the table-movement direction on a horizontal plane. Hereinafter, this perpendicular direction (i.e., the Y-axis direction) will be referred to as the "front-rear" direction, if appropriate. The PCB supporting device 16 is provided on the front side, and the movable EC supplying device 20 is provided on the rear side, as seen in the front-rear direction. Thus, the inclination adjusting device 90 is provided between the floor surface 10 and a rear portion of the frame 88. The air spring 96 is formed of a rubber, has a cylindrical shape, and is provided between the floor surface 10 and the frame 88. The air spring 96 has an air chamber in which air is enclosed. The elasticity of the air spring 96 can be adjusted by adjusting the pressure of the air enclosed in the air chamber thereof.

Figure 4:
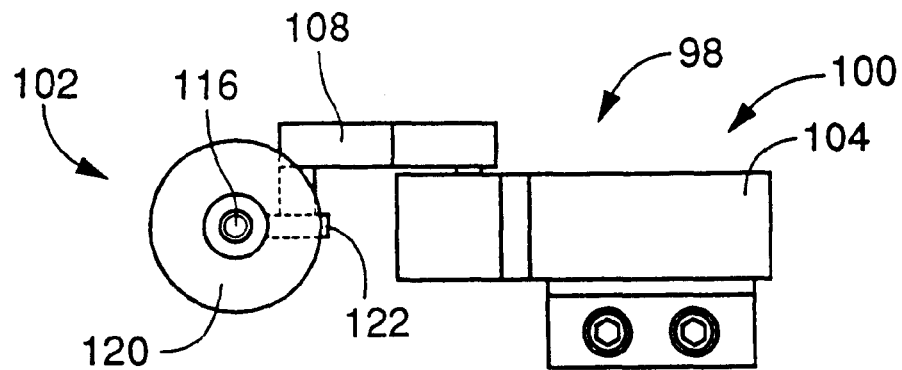
FIG. 4 is a leveling valve device of an inclination adjusting device as an element of the EC-mounter supporting apparatus of FIG. 1.
Figure 5:
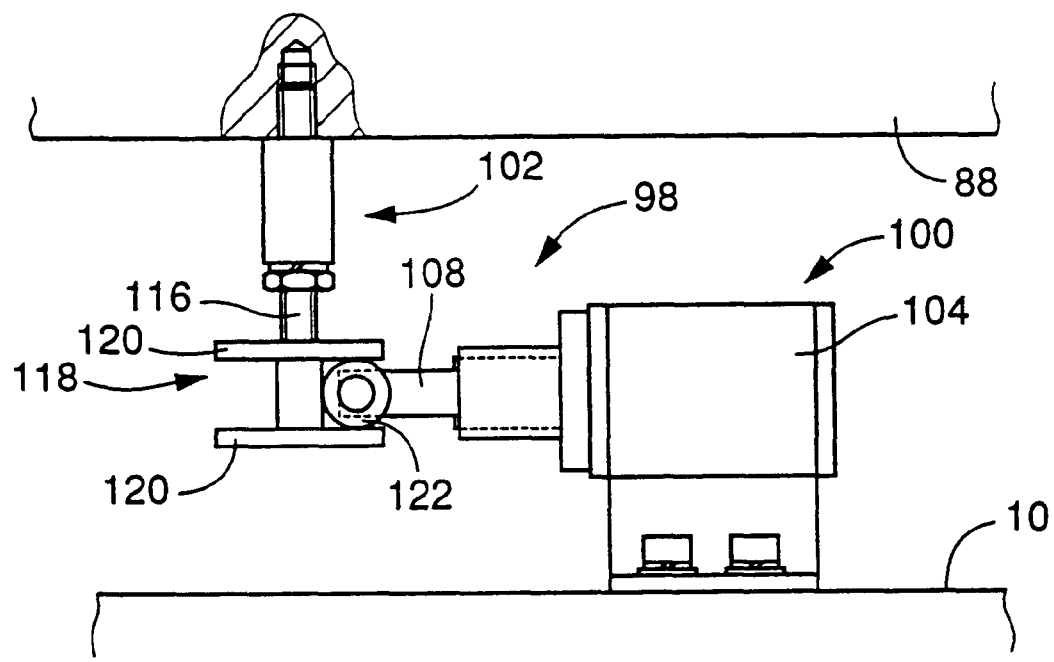
FIG. 5 is a front elevation view of the leveling valve device of FIG. 4.

As shown in FIGS. 4 and 5, the mechanical valve device 98 includes a direction control valve 100 and a dog device 102. A housing 104 of the direction control valve 100 is fixed to the floor surface 10, and is connected via a connection member (not shown) to a pressurized-air source 106 (FIG. 6) as a pressurized-gas source, and the air spring 96. The direction control valve 100 is provided by a spool valve as a sort of port valve, and includes a spool (not shown) which is accommodated in the valve housing 104 such that the spool is movable in the housing 104. The direction control valve 100 is selectively switched, by the movement of the spool, to an air-supply state in which the valve 100 allows the air spring 96 to be communicated with the pressurized-air source 106 so that a pressurized air is supplied to the air spring 96, and an air-relieve state in which the valve 100 allows the air spring 96 to be communicated with the atmosphere so that the pressurized air is relieved from the air spring 96. The spool of the valve 100 has two land portions corresponding to two ports of the housing 104 one of which communicates with the air source 106 and the other of which communicates with the atmosphere. The housing 104 has a third port which communicates with the air spring 96. An axial length of each of the two land portions of the spool is equal to, or just slightly greater than, a diameter of each of the two ports of the housing 104. The spool is moved by a pivotal motion of a pivotable lever 108 as an engaging member that is pivotally supported by the housing 104. In the state in which the pivotable lever 108 is positioned at a reference rotation or angular position, a portion of the pressurized air supplied from the air source 106 is directly released into the atmosphere, so that the air pressure in the air spring 96 is maintained at a certain value. When the lever 108 is pivoted from its reference position in each one of opposite directions, the spool is moved in a corresponding one of opposite directions, so that the valve 100 is switched to a corresponding one of the air-supply and air-relieve positions. Consequently the air pressure in the air spring 96 is changed. As far as the present embodiment is concerned, the reference position of the pivotable lever 108 is defined as a position where the lever 108 takes a horizontal posture.

Figure 6:
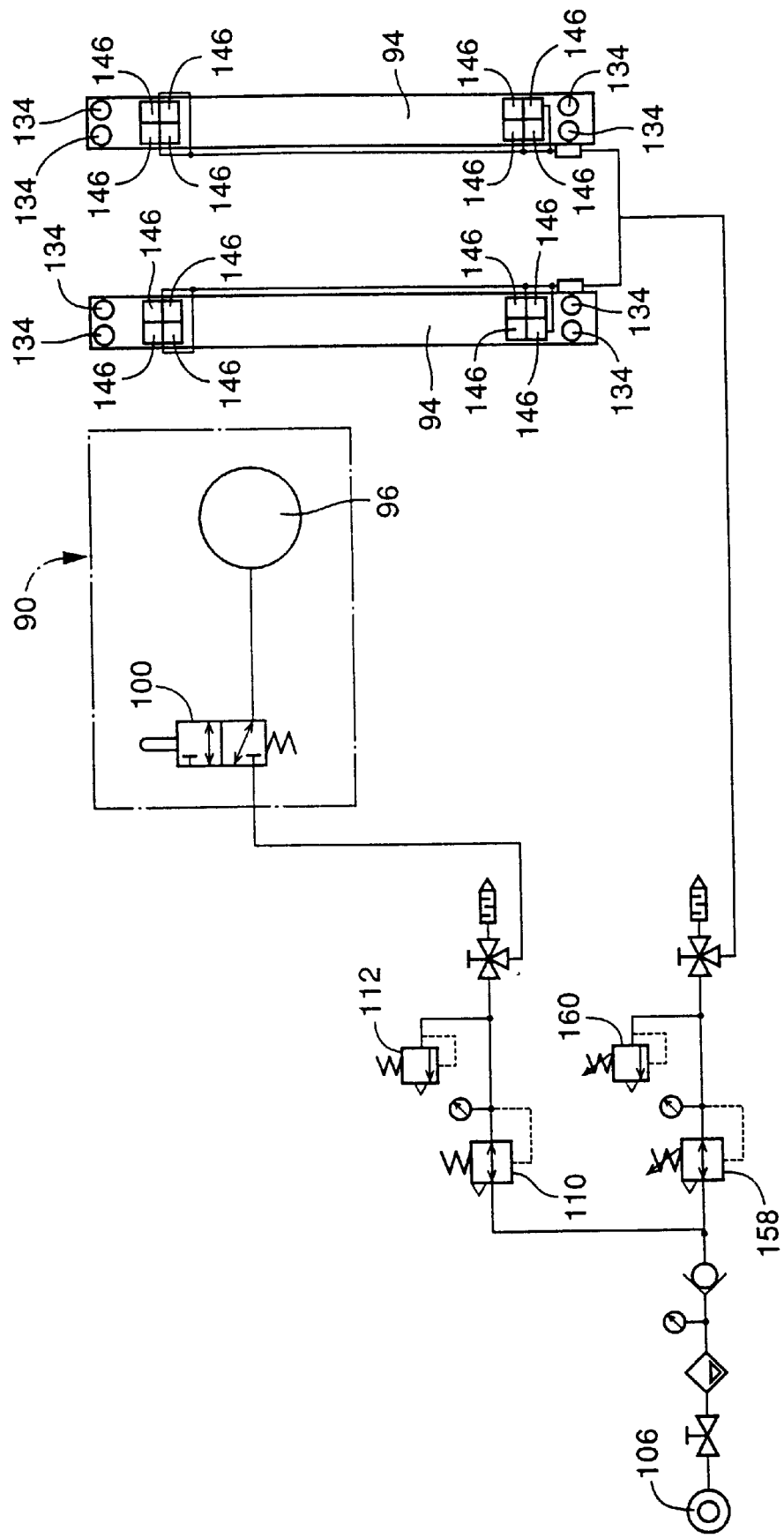
FIG. 6 is a diagrammatic view for explaining a manner in which air is supplied to a direction control valve of the leveling valve device of FIG. 4.

As shown in FIG. 6, a normally open pilot-type shut-off valve 110 and a normally closed pilot-type shut-off valve 112 are provided between the direction control valve 100 and the pressurized-air source 106. The valve closing pressure of the normally open valve 110 is higher than the pressure of the pressurized air supplied to the air spring 96, and the valve opening pressure of the normally closed valve 112 is slightly higher than the valve closing pressure. Owing to the two shut-off valves 110, 112, the pressure of the pressurized air supplied from the air source 106 is decreased to a desirable value before the air reaches the direction control valve 100.

As shown in FIG. 5, the dog device 102 includes a dog 118 which is attached via a screw member 116 to the frame 88, such that a height position of the dog 118 is adjustable. The dog 118 has a pair of flange portions 120 which extend radially outwardly. A roller 122 which is rotatably attached to a free end portion of the pivotable lever 108, as an engaging portion of the same 108, is inserted in an inner space defined, by and between, the two flange portions 120 of the dog 118.

The height position of the dog 118 is adjusted by an operator who rotates the screw member 116, such that the pivotable lever 108 takes its horizontal posture and the air pressure in the air spring 96 is maintained at a certain value, in the state in which the frame 88 is parallel to the floor surface 10. The adjustment of the height position of the dog 118 may be carried out, for example, when the EC mounter 14 is disposed on the frame 88 in such a manner that the movable table 70 on which no EC supplying units 72 have been mounted is positioned at the middle of the table-movement area as seen in the table-movement direction, i.e., the X-axis direction. As the weight of the movable EC supplying device 20 changes and the frame 88 is accordingly inclined relative to the floor surface 10 in the front-rear direction, the pivotable lever 108 is automatically pivoted by the dog 118, so that the direction control valve 100 is switched from the reference position to either one of the air-supply and air-relieve positions. Thus, the air pressure in the air spring 96 is automatically changed or adjusted to an appropriate value which can keep the horizontal posture of the lever 108 and an appropriate height of the air spring 96 that was initially taken by the same 96 when the height position of the dog 118 was adjusted. Accordingly, the inclination of the frame 88 relative to the floor surface 10 in the front-rear direction is prevented and the frame 88 is kept parallel to the floor surface 10. Thus, the dog device 102 functions not only as a switching device which switches the direction control valve 100 and which includes the dog 118 as a switching member, and but also as a dog-height-position adjusting device as a sort of relative-height-position adjusting device which adjusts the height position of the switching member (i.e., dog 118) relative to the valve 100. The relative-height-position adjusting device may be one which adjusts the height position of the valve 100 relative to the dog 118, or one which adjusts the height position of each one of the dog 118 and the valve 100 relative to the other of the dog 118 and the valve 100.

The three spring units 92 are available from a commercial market. Each of the spring units 92 includes a compression coil spring as a spring member as a sort of 40 elastic member, and a damper (not shown). The compression coil spring and the damper are provided in series in a vertical direction, between the floor surface 10 and the frame 88. The damper has a silicone chamber and a mass of silicone enclosed in the chamber. The damper damps the vibration of the frame 88 and the floor surface 10 relative to each other resulting from the compression and expansion of the coil spring. This damper is an unadjustable damper whose vibration damping characteristic is not adjustable. As shown in FIG. 2, two of the three spring units 92 are provided on both sides of the inclination adjusting device 90 in the X-axis direction (i.e., the table-movement direction), respectively, that is, at respective locations distant from each other in the X-axis direction and between the floor surface 10 and a rear end portion of the frame 22. The third spring unit 92 is provided at a location distant from the inclination adjusting device 90 in the Y-axis direction and between the floor surface 10 and a front end portion of the frame 22.

Next, the two supporting units 94 will be described. As shown in FIG. 2, the two supporting units 94 are provided at respective locations distant from each other in the table-movement direction parallel to a lengthwise direction of the frame 88. Since the two supporting units 94 have the same construction, one of the two units 94 will be described below as a representative thereof.

As shown in FIGS. 2, 7, 8, 9, and 10, one supporting unit 94 includes an upper member 130, a lower member 132, four compression coil springs. 134 as a sort of elastic members that are provided between the upper and lower members 130, 132, and eight adjustable dampers 136.

Figure 8:
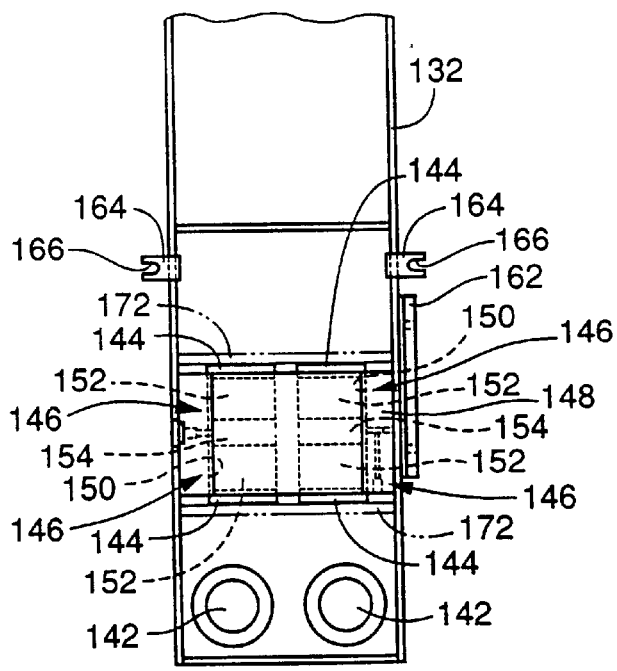
FIG. 8 is a plan view of one end portion of a lower member of the supporting unit of FIG. 7.
Figure 9:
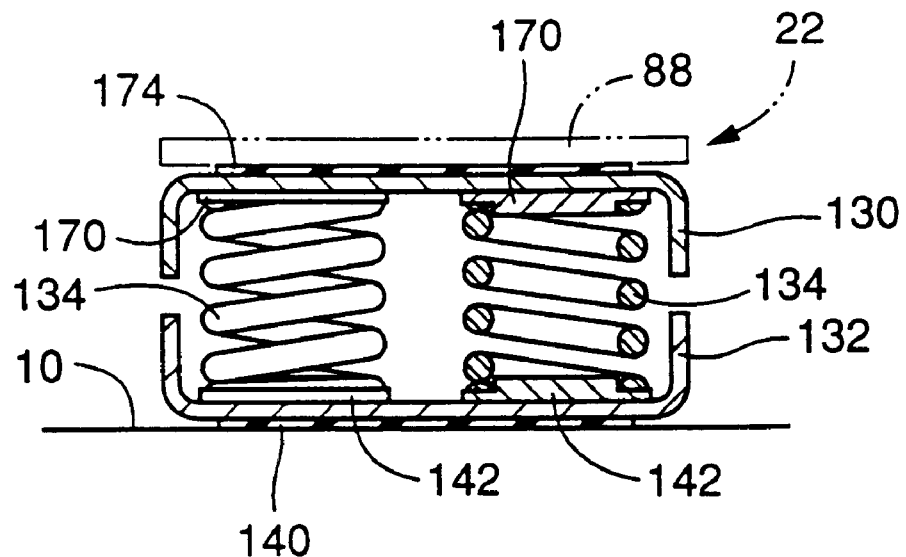
FIG. 9 is a partly cross-sectioned, front elevation view showing a compression coil spring as an element of the supporting unit of FIG. 7, in a state in which the coil spring is engaged with the upper and lower members.

As shown in FIGS. 8 and 9, the lower member 132 is an elongate member having a generally U-shaped cross section. The lower member 132 is placed on the floor surface 10 via a pad 140 such that the opening thereof faces upward and the lengthwise direction thereof is perpendicular to the table-movement direction on a horizontal plane. The pad 140 includes an elastic sheet which is formed of a rubber, or a resin having a certain degree of elasticity, and two tacky layers which are provided on opposite surfaces of the elastic sheet. Thus, the pad 140 has a certain degree of tackiness, and is fixed to the floor surface 10 and the lower member 132. Therefore, the lower member 132 is prevented from being moved relative to the floor surface 10. In addition, owing to the elasticity of the pad 140, the lower member 132 is kept stable on the floor surface 10. Thus, each of the two pads 140 provides a fixing member for fixing a corresponding one of the two lower members 132, or a corresponding one, of the two supporting units 94, to the floor surface 10. The lower members 132 provide stationary members.

Two spring retainers 142 are fixed to each of lengthwise opposite end portions of the lower member 132. Thus, four spring retainers 142 in total are provided on the lower member 132. However, FIG. 8 shows only two retainers 142 fixed to one end portion of the lower member 132. Each of the four spring retainers 142 has a circular cross section, and projects upward from the lower member 132. The two spring retainers 142 provided on each of the two end portions of the lower member 132 are arranged side by side in the table-movement direction.

On each of the lengthwise opposite end portions of the lower member 132, four friction members 144 and four air-pressure-operated cylinder devices (hereinafter, abbreviated to the "air cylinders") 146 are provided in the vicinity of the two spring retainers 142 in the lengthwise direction of the lower member 132. FIG. 8 shows the four friction members 144 and the four air cylinders 146 provided on one of the two end portions of the lower member 132. Since the friction members 144 and the air cylinders 146 provided on the one end portion are identical with those 144, 146 provided on the other end portion, only the friction members 144 and the air cylinders 146 provided on the one end portion will be described below.

A cylinder housing 148 is provided, as an integral portion of the lower member 132, in the vicinity of the spring retainers 142. The cylinder housing 148 has two cylindrical bores 150 which are formed through the housing 148 in a direction parallel to the lengthwise direction of the lower member 132 and perpendicular to the table-movement direction on a horizontal plane. Two pistons 152 are airtightly and slideably fitted in each of the two bores 150, such that the two pistons 152 face in opposite directions.

The two pistons 152 fitted in each of the two cylindrical bores 150 project outward in the opposite directions from opposite end surfaces of the cylinder housing 148 in the lengthwise direction of the lower member 132. The four friction members 144 are fixed to respective end surfaces of the four pistons 152 projecting outward from the housing 148. Thus, the four air cylinders 146 extend perpendicular to the table-movement direction on the horizontal plane and parallel to the lengthwise direction of the lower member 132, and the four friction members 144 vertically extend parallel to the table-movement direction.

One air chamber 154 is defined by, and between, the two pistons 152 fitted in each of the two cylindrical bores 150. As shown in FIG. 6, the two air chambers 154 are connected to the pressurized-air source 106. Between the air chambers 154 and the air source 106, there are provided a normally open pilot-type variable shut-off valve 158 and a normally closed pilot-type variable shut-off valve 160 each of which includes a spring incorporated therein. The valve closing pressure of the normally open valve 158 and the valve opening pressure of the normally closed valve 160 can be adjusted by changing respective biasing forces of the respective springs of the valves 158, 160. Thus, the pressure of the pressurized air supplied to the air chambers 154 can be adjusted. The valve closing pressure can be predetermined to be equal to a desirable air pressure to be supplied to the air chambers 154, and the valve opening pressure can be predetermined to be slightly higher than the desirable air pressure. Thus, the pressurized air with the desirable pressure can be supplied to the air chambers 154.

Figure 10:
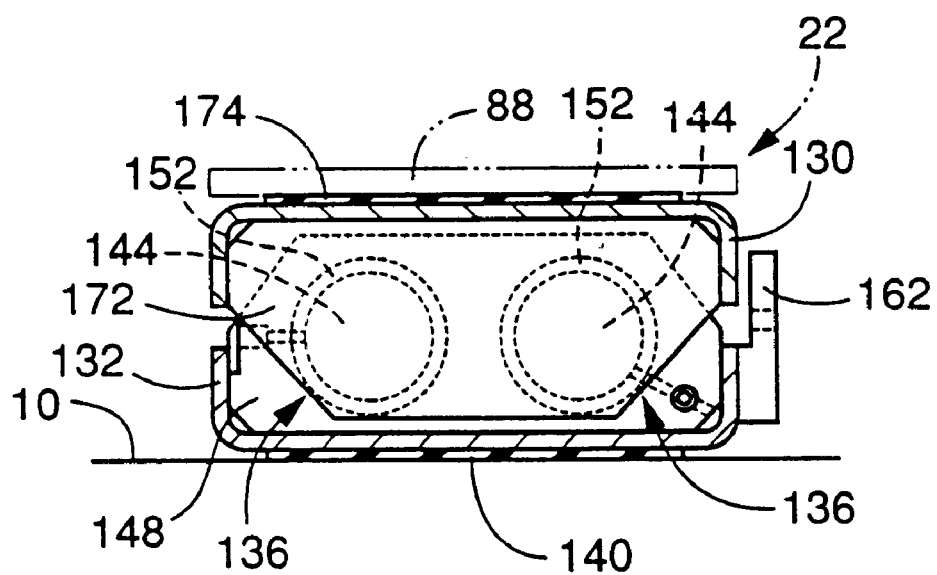
FIG. 10 is a partly cross-sectioned, front elevation view showing a press in a device as an element of the supporting unit of FIG. 7.

As shown in FIG. 10, one of the lengthwise opposite end portions of each of the respective lower members 132 of the two supporting units 94 is provided with an engaging member 162. The PCB carry-in conveyor 46 is held in engagement with the engaging member 162 of one of the two supporting units 94, and the PCB carry-out conveyor 48 is held in engagement with the engaging member 162 of the other supporting unit 94.

The lower member 132 is provided with two pairs of connection members 164 at respective positions distant from each other in the lengthwise direction of the lower member 132. FIG. 8 shows only one pair of connection members 164 provided at one of the two distant positions. Each of the connection members 164 has a generally U-shaped recess 166 which is formed through the thickness of the each member 164 in a vertical direction and opens outward in a horizontal direction. The function of the connection members 164 will be described later.

Figure 7:
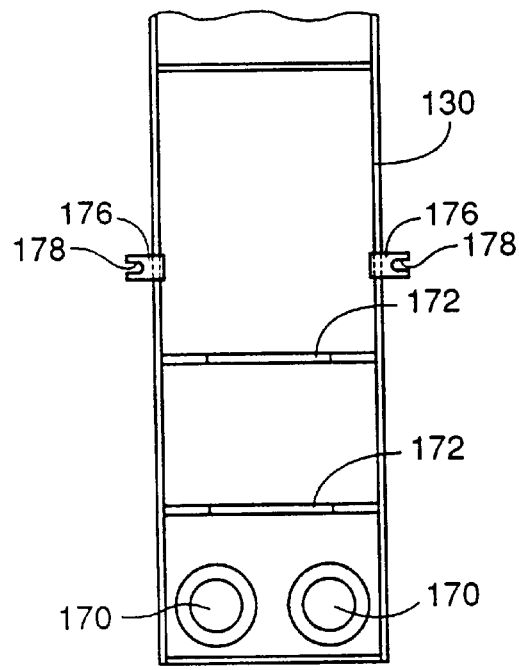
FIG. 7 is a bottom view of one end portion of an upper member of a supporting unit as an element of the EC-mounter supporting apparatus of FIG. 1.

As shown in FIGS. 7 and 9, the upper member 130 is an elongate member having a generally U-shaped cross section. Two spring retainers 170 are fixed to each of lengthwise opposite end portions of the upper member 130. Thus, four spring retainers 170 in total are provided on the upper member 130. However, FIGS. 7 and 9 show only two retainers 170 fixed to one end portion of the upper member 130. Each of the four spring retainers 170 has a circular cross section, and projects downward from the upper member 130. The two spring retainers 170 provided on each of the two end portions of the upper member 130 are arranged side by side in the table-movement direction. The upper member 130 is provided such that the opening thereof faces downward and the lengthwise direction thereof is perpendicular to the table-movement direction. Each of the four spring retainers 170 cooperates with a corresponding one of the four spring retainers 142 provided on the lower member 132 to retain opposite end portions of a corresponding one of the four compression coil spring 134. Thus, each of the lengthwise opposite end portions of each of the upper and lower members 130, 132 is provided with the two compression coil springs 134. It can be said that each of the two end portions of each of the two supporting units 94 is provided with a group of spring members, i.e., the two coil springs 134.

As shown in FIG. 7, on each of the lengthwise opposite end portions of the upper member 130, two friction ribs 172 are provided in the vicinity of the two spring retainers 170 in the lengthwise direction of the upper member 130, such that the two friction ribs 172 are distant from each other in a direction perpendicular to the table-movement direction, that is, in the lengthwise direction of the upper member 130. FIG. 7 shows the two friction ribs 172 provided on one of the two end portions of the upper member 130. The friction ribs 172 extend perpendicular to the lengthwise direction of the upper member 130 and parallel to a widthwise direction of the same 130. That is, the friction ribs 172 vertically extend parallel to the table-movement direction. The friction ribs 172 provide movable members. The four friction members 144 and the four air cylinders 146 provided on each of the two end portions of the lower member 132 are fitted in a space defined by, and between, the two friction ribs 172 provided on a corresponding one of the two end portions of the upper member 130. Thus, respective surfaces of the four friction members 144 are pressed against respective surfaces of the two friction ribs 172 by the four air cylinders 146. Those surfaces of the friction members and ribs 144, 172 will be referred to as the "friction surfaces". The friction surfaces are vertical, and parallel to the table-movement direction. Thus, the four friction members 144, the four air cylinders 146, the two friction ribs 172, and one of the two end portions of the lower member 132 cooperate with one another to provide the four adjustable dampers 136. That is, the four adjustable dampers 136 are provided at each of the lengthwise opposite end portions of each of the two supporting units 94. It can be said that each of the two end portions of each of the supporting units 94 is provided with a group of dampers, i.e., the four adjustable dampers 136. Thus, the EC-mounter supporting apparatus 12 includes the four group of spring members and the four groups of dampers which are provided at respective locations corresponding to the four corners of the frame 88 as the base member 22.

As shown in FIG. 9, the frame 88 as the base member 22 is placed on the two upper members 130 via respective pads 174. Like the above-described pads 140, each of the pads 174 includes an elastic sheet and two tacky layers applied to opposite surfaces of the elastic sheet. Thus, each of the two pads 174 has some degree of tackiness, and is firmly fixed to the frame 88 and a corresponding one of the upper members 130. Therefore, the frame 88 is prevented from being moved relative to the upper members 130, and accordingly the frame 88 is kept stable on the upper members 130. Thus, the pads 174 provide fixing members for substantially fixing the frame 88, i.e., the base member 22 to the upper members 130.

Like the lower members 132, each of the upper members 130 is provided with two pairs of connection members 176 at respective positions distant from each other in the lengthwise direction of the each upper member 130. FIG. 7 shows only one pair of connection members 176 provided at one of the two distant positions. Each of the connection members 176 has a generally U-shaped recess 178 similar to each of the respective recesses 166 of the connection members 164.

When the EC mounter 14 is disposed on the floor surface 10 via the EC-mounter supporting apparatus 12, the two upper members 130 are opposed to the two lower members 132, respectively, such that the downward openings of the upper members 130 face the upward openings of the lower members 132, respectively. In addition, as shown in FIG. 9, the upper spring retainers 170 and the lower spring retainers 142 cooperate with each other to retain the compression coil springs 134. Screw members such as bolts are passed through the pairs of recesses 166, 178 of the connection members 164, 176 of the lower and upper members 132, 130, respectively, and nuts are threadedly engaged with the screw members, respectively, till each pair of connection members 164, 176 are closely contacted with each other. Thus, the two upper members 130 are firmly combined with the two lower members 132, respectively. Consequently the compression coil springs 134 are pre-compressed.

After the lower members 132 are placed on the floor surface 10 via the pads 140 and the frame 88 as the base member 22 is placed on the upper members 130 via the pads 174, the nuts are removed from the screw members, respectively, so that the upper members 130 are released from the lower members 132, respectively. On the frame 88, the PCB supporting device 16, the mounting device 18, and the movable table 70 and the movable-table moving device 74 of the movable EC supplying device 20 have already been mounted. Since the upper members 130 are released from the lower members 132, the compression coil springs 134 are more or less expanded and the upper members 130 are more or less separated from the lower members 132. The distance of the upper members 130 from the corresponding lower members 132 depends on the load of the EC mounter 14 acting on the upper members 130 and the spring characteristic of the compression coil springs 134. Thus, as shown in FIG. 9, the upper members 130 are allowed to move relative to the lower members 132 because of the expansion and compression of the coil springs 134. Since the upper and lower members 130, 132 hold the upper and lower end portions of the coil springs 134, the members 130, 132 are prevented from being dislocated relative to the springs 134 and accordingly the frame 88 is prevented from being dislocated relative to the floor surface 10. In addition, as shown in FIG. 10, the friction ribs 172 are opposed to the friction members 144 and, when the pressurized air is supplied to the air chambers 154 of the air cylinders 146, the friction members 144 are pressed against the friction ribs 172. After the EC mounter 14 is placed on the floor surface 10 via the supporting units 94 in this way, the three spring units 92 and the inclination adjusting device 90 are disposed between the frame 88 and the floor surface 10.

When ECs are mounted on a PCB 32, the drive motor (i.e., servomotor) of the cam drive device drives the four globoidal cams, so that the twelve rotary plates 60 are rotated independent of one another and the EC holding heads 62 are sequentially moved to the EC-suck position, the EC-image-take position, and the EC-mount position. After the EC sucker of each holding head 62 sucks up an EC from the EC-supply portion of one EC supplying unit 72 being positioned at the EC-receive position (i.e., EC-suck position), an image of the EC held by the EC sucker is taken by the CCD camera. A control device (i.e., computer) to which the CCD camera is connected calculates respective errors of the actual position of the EC from its reference position in the X-axis and Y-axis directions, and an error of the actual rotation position of the EC from its reference rotation position about its axis line. The EC-sucker rotating device rotates the EC sucker and thereby rotates the EC held thereby, about its axis line, for correcting the rotation-position error of the EC. Subsequently, the EC is mounted on the PCB 32.

In the movable EC supplying device 20, each of the respective EC-supply portions of the EC supplying units 72 is selectively positioned at the EC-suck position by the movement of the movable table 70. In the PCB supporting device 16, each time one EC is mounted on the PCB 32, the PCB 32 is moved by the X-axis and Y-axis tables 28, 30, so that the next EC-mount place on the PCB 32 is positioned below the EC sucker of one EC holding head 62 being positioned at the EC-mount position. The distances of movement of the X-axis and Y-axis tables 28, 30 are corrected for compensating the position errors of the center of the EC held by the EC sucker in the X-axis and Y-axis directions, and possible position errors of the next EC-mount place on the PCB 32 in the X-axis and Y-axis directions. Before the ECs are mounted on the PCB 32, two reference marks (not shown) affixed on a diagonal line of the PCB 32 are imaged by a reference-mark-image taking device (not shown) which is connected to the control device, and the control device calculates, based on the taken image, the position errors of each of the EC-mount places on the PCB 32 in the X-axis and Y-axis directions. The position errors of the center of the EC held by the EC sucker in the X-axis and Y-axis directions, are the sum of respective position errors of the center of the EC produced when the EC is held by the EC sucker and respective position changes of the center of the EC produced when the EC is rotated for correcting its rotation-position error.

In the EC mounter 14, when the movable table 70, the X-axis and Y-axis tables 28, 30, and the rotary plates 60 are accelerated and decelerated, the frame 88 as the base member 22 is vibrated. Because of the elastic deformation of the four compression coil springs 134 of each of the two supporting units 94, the compression coil spring of each of the three spring units 92, and the air spring 96, the frame 88 is allowed to move relative to the floor surface 10. Thus, the transmission of the vibration of the frame 88 to the floor 10 is avoided. In addition, owing to the respective unadjustable dampers of the spring units 92 and the eight adjustable dampers 136 of each of the two supporting units 94, the vibration of the frame 88 and the floor 10 relative to each other is damped. Each of the compression coil springs which extend perpendicular to the floor surface 10 can be deformed in each of the vertical direction, the table-movement direction, and the front-rear direction. Thus, the frame 88 and the floor surface 10 are allowed to be vibrated relative to each other in all directions. The air spring 96 also allows the frame 88 and the floor surface 10 to be vibrated relative to each other in all directions.

When the frame 88 is moved relative to the floor surface 10, the upper members 130 of the supporting units 94 are moved relative to the lower members 132 of the same 94. In the adjustable dampers 136, since the friction members 144 are pressed against the friction ribs 172 by the air cylinders 146, the vibrational energy of the frame 88 and the floor 10 is converted into thermal energy. Thus, the vibration of the frame 88 and the floor 10 relative to each other is damped. The friction members 144 and the friction ribs 172 vertically extend parallel to the table-movement direction. Thus, the adjustable dampers 136 damp the vibration of the frame 88 and the floor 10 relative to each other in all directions on the vertical plane parallel to the table-movement direction. As described previously, the compression coil springs 134 and the adjustable dampers 136 are provided at respective locations corresponding to the four corners of the frame 88. Thus, the frame 88 is very stably supported relative to the floor surface 10. That is, the frame 88 as a whole is allowed to move relative to the floor surface 10, while the vibration of the frame 88 and the floor 10 relative to each other is damped. The unadjustable dampers of the spring units 92 damp the vibration of the frame 88 and the floor 10 relative to each other in each of a vertical direction and a horizontal direction.

The movable table 70 on which the plurality of EC supplying units 72 are mounted has a great mass. Therefore, when the movement of the movable table 70 is started or stopped, the frame 88 is subjected to a vibrational force produced in a direction parallel to the direction of movement of the table 70, i.e., the table-movement direction. As described previously, the frame 88 is also subjected to a rotational vibration. Thus, portions of the frame 88 that are supported by the EC-mounter supporting apparatus 12 are vibrated in all directions on a vertical plane parallel to the table-movement direction. Since, however, the two supporting units 94 are provided at respective positions which are distant from each other in the table-movement direction, the adjustable dampers 136 effectively damp the vibration of the frame 88 and the floor 10 relative to each other in all directions on the vertical plane parallel to the table-movement direction. Thus, not only the vibration transmitted to the floor 10 but the vibration transmitted to the EC mounter 14 are largely reduced. This vibration is also damped by the unadjustable dampers of the spring units 92. When the Y-axis table 30 is moved, the frame 88 is subjected to a vibrational force produced in the front-rear direction perpendicular to the table-movement direction on a horizontal plane. However, this vibration is not so large. Thus, there arises no problem even if no damper is employed for damping the vibration of the frame 88 and the floor 10 relative to each other in the front-rear direction.

The vibration-damping characteristic of each of the adjustable dampers 136 is adjustable depending upon each EC mounter 14. This characteristic is adjusted by adjusting the valve closing pressure of the pilot-type variable shut-off valve 158 and the valve opening pressure of the pilot-type variable shut-off valve 160, and thereby adjusting the pressure of the air supplied to the air chambers 154 of the air cylinders 146, that is, adjusting the pressing force of the air cylinders 146 to press the friction members 144 against the friction ribs 172. This adjustment is carried out when the EC mounter 14 is disposed on the frame 88 as the base member 22. The EC mounter 14 is run for trial, and the vibration of the floor 10 produced by this trial run is measured. The air pressure is so determined that the amplitude of vibration of the floor 10 is small and the amplitude of vibration of the mounter 14 is not excessively great. The amplitude of vibration of the EC mounter 14 changes depending upon the conditions of the floor 10, e.g., its rigidity, mass, and vibration-damping characteristic thereof. Hence, it is advantageous to employ the adjustable dampers 136. If, when the EC mounter 14 is disposed, the vibration-damping characteristic of one or more of the adjustable dampers 136 is adjusted depending upon the conditions of the floor 10, the amplitude of vibration of the floor 10 can be minimized. In addition, the amplitude and frequency of the vibration transmitted from the frame 88 to the floor 10 change depending upon the conditions of the EC mounter 14, e.g., the mass of the mounter 14 itself, and the speed of movement of each of the X-axis and Y-axis tables 28, 30 and the movable table 70. The mass of the movable EC supplying device as a whole changes as the number of EC supplying units 72 mounted on the movable table 70 changes and/or as the number of ECs stored in each of the EC supplying units 72 changes. The speed of operation of the EC mounter 14 changes. However, since the vibration-damping characteristic of each of the adjustable dampers 136 is most appropriately adjustable, the vibration which is transmitted to the floor 10 is more effectively reduced and any excessive vibration of the EC mounter 14 is most effectively prevented.

The load and vibrational force exerted to a first portion of the frame 88 that supports the movable table 70 are greater than those exerted to a second portion of the frame 88 that is opposite to the first portion with respect to the mounting device 18. However, the greater number of spring units 92 (i.e., two) are provided between the first portion and the floor surface 10 than the number of spring unit(s) 92 (i.e., one) provided between the second portion and the floor surface 10. Therefore, the frame 88 is kept horizontal, and the vibration of the frame 88 produced by the movement of the movable table 70 is effectively damped.

Thus, the present EC-mounter supporting apparatus 12 can damp the vibration of the frame 88 relative to the floor surface 10, while permitting the frame 88 to move relative to the floor surface 10. Since the relative vibration of the frame 88 and the floor surface 10 is reduced by the adjustable dampers 136 of the supplying units 94 and the unadjustable dampers of the spring units 92, the vibration is transmitted as such to the floor 10.

The present EC-mounter supporting apparatus 12 permits the base member 22 in the form of the frame 88 to move relative to the floor surface 10, and damps the relative vibration of the base member 32 and the floor surface 10. More specifically described, the elastic deformation of the springs 134 permits the base member 22 to move relative to the floor surface 10, so that the vibration of the EC mounter 14 is prevented from being transmitted to the floor 10. If the base member 22 is disposed directly on the floor surface 10, the base member 22 and the floor surface 10 would be vibrated as a unit and the floor surface 10 would be largely vibrated. According to the present invention, the base member 22 is supported on the floor surface 10 via the springs 134. Accordingly, the vibration of the floor surface 10 is reduced, but the vibration of the base member 22 is increased. Moreover, the floor surface 10 may resonate with the base member 22 and the vibration of the surface 10 may be amplified. To solve this, the adjustable dampers 136 and the unadjustable dampers damp the vibration of the base member 22. Since the dampers are provided between the base member 22 and the floor surface 10, a portion of the vibration of the base member 22 is damped by the dampers whereas another portion of the vibration is transmitted to the floor surface 10 via the dampers. However, this portion is considerably smaller than the vibration which would be transmitted to the floor 10 in the case where neither the springs 134 nor the dampers 136 are provided. Thus, the vibration of the floor surface 10 is largely reduced, and the vibration of the base member 22 is prevented from lasting for a long time, or being amplified because of resonance.

Thus, the amount of misalignment between the board holding device of the PCB supporting device 16 and the PCB carry-in or carry-out conveyor 46, 48 when the holding device receives the PCB 32 from the carry-in device 46 or when the holding device passes the PCB 32 to the carry-out device 48, is negligibly small. Accordingly, the PCB 32 can be passed and received without any problems. More specifically described, after all the ECs are mounted on the current PCB 32, the current PCB 32 is passed to the PCB carry-out conveyor 48, and a new PCB 32 is carried in onto the board holding device. Concurrently with the carrying-out of the current PCB 32 and/or the carrying-in of the new PCB 22, the movable table 70 is returned to its EC-supply start position, which may produce vibration. However, since this vibration is effectively reduced, the board holding device is effectively prevented from being misaligned with the PCB carry-in or carry-out conveyor 46, 48, so that the PCBs 32 can be received and passed, without failure, among the board holding device and the carry-in and carry-out conveyors 46, 48.

The mounting device 18 takes an EC from the EC supplying device 20, in the state in which the EC mounter 14 is being vibrated. However, after possible X-axis-direction and Y-axis-direction position errors and rotation or angular position error of the EC held by the EC sucker are corrected, the EC is mounted on the PCB 32. Thus, the position errors of the EC possibly resulting from the vibration are eliminated. Likewise, the EC is mounted on the PCB 32 in the state in which the EC mounter 14 is being vibrated. However, experiments have proved that the accuracy with which the EC mounter 14 mounts the EC on the PCB 32 is comparable to that of a conventional EC mounter which is not used with the present supplying apparatus 12 but is used with a leveling sheet provided on the floor surface 10 and a plurality of leveling bolts engaged with the leveling sheet.

In the present EC mounter 14, the respective movable portions (i.e., the X-axis table 28, the Y-axis table 30, the rotary plates 60, the movable table 70, etc.) of the PCB supporting device 16, the mounting device 18, and the movable EC supplying device 20 are moved by the servomotors 34, 76 as the drive sources. Since the frequency of vibration of the EC mounter 14 is much smaller than the frequency of response of the servomotors 34, 76, the servomotors 34, 76 are effectively responsive to the vibration. More specifically described, when the base member 22 is vibrated, the PCB supporting device 16, the mounting device 18, and the movable EC supplying device 20 which are supported on the base member 22 are vibrated with the base member 22, so that each of the movable portions (e.g., the X-axis table 28) of the devices 16, 18, 20 is subjected to an inertia force equal to the product of its mass and the acceleration of the vibration. This inertia force changes at the same frequency (e.g., 10 Hz) as that of the vibration of the base member 22. Thus, the load exerted to the servomotor (e.g., the X-axis-table drive motor 34) which drives the each movable portion changes at that frequency. However, the frequency of response of the servomotor 34 is about 80 Hz much higher than 10 Hz, and accordingly the drive or output torque of the servomotor 34 increases and decreases as the load exerted thereto increases and decreases. Thus, each movable portion can be accurately moved to a predetermined position. That is, the EC mounter 14 is free from the problem that the accuracy of mounting of ECs is lowered because of the vibration of the base member 22.

The inclination adjusting device 90 can keep the frame 88 horizontal, i.e., parallel to the floor surface 10, even though the weight of the movable EC supplying device 20 as a whole may change. As described previously, the height position of the dog 118 may be adjusted, when the EC mounter 14 is disposed, in the state in which no EC supplying units 72 have been mounted on the movable table 70. Accordingly, if the EC supplying units 72 are mounted on the movable table 70, the mass of the movable EC supplying device 20 increases, which leads to increasing the load exerted to the rear portion of the frame 88 that supports the supplying device 20. Therefore, the respective compression coil springs of the two spring units 92 provided on both sides of the inclination adjusting device 90 in the table-movement direction (i.e., the two units 92 provided between the rear portion of the frame 88 and the floor surface 10), half the respective compression coil springs 134 of the two supporting units 94 that are provided on the side of the rear portion of the frame 88, and the air spring 96 are compressed. Thus, the pivotable lever 108 is pivoted toward the air-supply position (counterclockwise in FIG. 5) of the direction control valve 100, and eventually the control valve 100 is switched to the air-supply position. As a result, the pressurized air is supplied to the air spring 96 and the air pressure of the air spring 96 is increased. Since the elasticity of the air spring 96 is increased, the rear portion of the frame 88 is raised. When the elasticity of the air spring 96 is increased by an amount corresponding to the increased amount of the mass of the EC supplying device 20, the pivotable lever 108 is returned to its initial horizontal posture, i.e., its reference position. Thus, the supplying of the pressurized air to the air spring 96 is stopped. In short, even though the load applied to the rear portion of the frame 88 may be increased because of the increased weight of the EC supplying device 20, the height of the air spring 96 is kept at a predetermined value, and the height position of the frame 88 from the floor surface 10 is kept at a predetermined position. Thus, the frame 88 is kept parallel to the floor surface 10. The total number of the EC supplying units mounted on the movable table 70 varies depending upon, e.g., the sort of the PCB 32 in use. In each case, the frame 88 as the base member 22 is kept parallel to the floor surface 10.

On the other hand, as the supplying of the ECs from the EC supplying units 72 to the mounting device 18 progresses, the number of the ECs held by each of the supplying units 72 decreases, which leads to decreasing the weight of the movable EC supplying device 20. In this case, the rear portion of the frame 88 moves upward, which causes the pivotable lever 108 to be pivoted toward the air-relieve position of the direction control valve 100 (clockwise in FIG. 5), thereby causing the control valve 100 to be switched to the air-relieve position. Thus, the pressurized air is relieved from the air spring 96 into the atmosphere, and the air pressure of the air spring 96 is lowered. Therefore, the elasticity of the air spring 96 is decreased, and the rear portion of the frame 88 is lowered. When the elasticity of the air spring 96 is decreased by an amount corresponding to the decreased amount of the weight of the EC supplying device 20, the pivotable lever 108 is returned to its initial horizontal posture, i.e., its reference position. Thus, the relieving of the pressurized air from the air spring 96 is stopped. In short, even though the load applied to the rear portion of the frame 88 may be decreased because of the decreased weight of the EC supplying device 20, the height of the air spring 96 is kept at the predetermined value, and the height position of the frame 88 from the floor surface 10 is kept at the predetermined position. Thus, the frame 88 is automatically kept parallel to the floor surface 10, though the total number of the ECs or the total weight of the EC supplying device 20 gradually decreases during the EC mounting operation.

Thus, the height of the air spring 96 is kept at the predetermined value, though the load exerted to the rear portion of the frame 88 changes. That is, the inclination of the frame 88 relative to the floor surface 10 in the front-rear direction is adjusted, and the frame 88 is kept parallel to the floor surface 10. The direction control valve 100 is provided by a valve which is automatically and mechanically switched in response to the inclination of the frame 88 relative to the floor surface 10. Since the control valve 100 is mechanically switched in response to the inclination of the frame 88, the valve 100 is opened by an amount corresponding to the amount of inclination of the frame 88. For example, in the state in which the frame 88 is inclined by a small amount, the valve 100 is opened by a small amount, which allows a small amount of air to be flown into, or out of, the air spring 96. Thus, the flow-direction control valve 100 also functions as a flow-amount control valve. Therefore, the inclination of the frame 88 is finely adjusted in the automatic manner.

Figure 11:
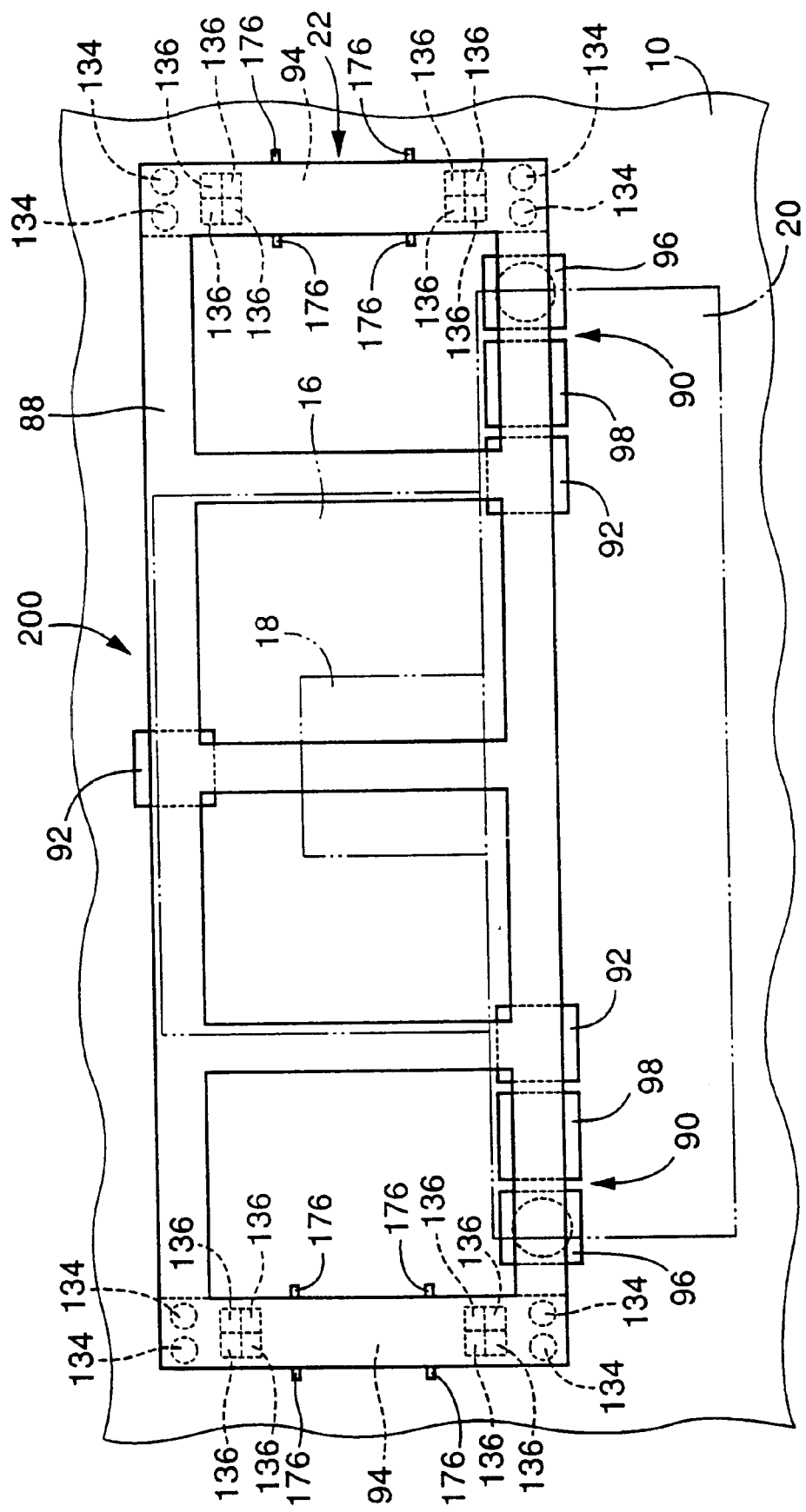
FIG. 11 is a plan view of another EC-mounter supporting apparatus as a second embodiment of the present invention, and a frame as a base member of an EC mounter.

The EC-mounter supporting apparatus 12 shown in FIG. 2 includes just one inclination adjusting device 90 to its advantage. However, FIG. 11 shows another EC-mounter supporting apparatus 200 which includes two inclination adjusting devices 90. The two adjusting devices 90 are provided, between the floor surface 10 and a portion of the frame 88 that supports the movable table 70, at respective locations corresponding to opposite end portions of the table-movement area in the table-movement direction. Each of the two adjusting devices 90 of the supporting apparatus 200 is identical with the adjusting device 90 of the supporting apparatus 12, i.e., includes the air spring 96 and the mechanical valve device 98. The two adjusting devices 90 of the supporting apparatus 200 are identical with each other, and are arranged symmetrically with each other with respect to a plane which passes through the center of the frame 88 and is perpendicular to the plane of the frame 88 and to the lengthwise direction of the frame 88.

Since the two inclination adjusting devices 90 are provided at respective positions distant from each other in a direction parallel to the table-movement direction, the adjusting devices 90 cooperate with each other to adjust, like the inclination adjusting device 90 of the EC-mounter adjusting apparatus 12, the inclination of the frame 88 relative to the floor surface 10 in a direction perpendicular to the direction in which the respective EC-supply portions of the EC supplying units 72 are arranged on the movable table 70. Thus, the frame 88 is kept parallel to the floor surface 10. Even though the balance of respective loads exerted to the supporting apparatus 200 from two portions of the frame 88 that are distant from each other in the table-movement direction may be broken as the movable table 70 is moved, the frame 88 can be kept parallel to the floor surface 10. Like the single adjusting device 90 of the supporting apparatus 12, each of the two adjusting devices 90 of the supporting apparatus 200 can be adjusted such that the direction control valve 100 of the each device 90 is switched to adjust the air pressure of the air spring 96 and thereby keep the predetermined height of the air spring 96. Thus, the frame 88 is kept parallel to the floor surface 10.

In the case where the floor surface 10 has a great undulation or inclination, the EC-mounter supporting apparatus 12 or 200 may be disposed on the floor surface 10 via one or more level-adjust members (e.g., steel plates) having appropriate thicknesses. In this case, leveling bolts may be used to make a horizontal plane which supports the supporting apparatus 12, 200 and the EC mounter 14.

According to the principle of the present invention, an EC-mounter supporting apparatus may include one or more elastic members and one or more unadjustable dampers but may not include any adjustable dampers. For example, in the EC-mounter supporting apparatus 12, 200, the two supporting units 94 may be replaced with additional two spring units 92.

Otherwise, the pilot-type variable shut-off valves 158, 160 may be replaced with respective pilot-type shut-off valves each of which is not adjustable with respect to its valve opening or closing pressure, i.e., has a predetermined valve opening or closing pressure.

The EC-mounter supporting apparatus 12, 200 may employ three or more inclination adjusting devices 90. For example, it is possible that two adjusting devices 90 be provided between the floor surface 10 and two portions of the frame 88 that support the movable table 70 and are distant from each other in the table-movement direction, and one adjusting device 90 be provided between the floor surface 10 and a portion of the frame 88 that supports the PCB supporting device 16 and is opposite to the EC supplying device 20 with respect to the mounting device 18 in the front-rear direction. Otherwise, it is possible that in addition to the two adjusting devices 90 provided between the floor surface 10 and the two portions of the frame 88 that support the movable table 70 and are distant from each other in the table-movement direction, two more adjusting device 90 be provided between the floor surface 10 and two portions of the frame 88 that support the PCB supporting device 16 and are distant from each other in the direction in which the PCB 32 is conveyed by the PCB carry-in and carry-out devices 46, 48, this direction being parallel to the table-movement direction. In the latter case, the four adjusting devices 90 in total are provided at respective positions corresponding to the four corners of the frame 88. In each case, the inclination of the frame 88 relative to the floor surface 10 is adjusted and the frame 88 is kept parallel to the floor surface 10. In addition, the height position of the frame 88 or the EC-mounter 14 can be adjusted to a desirable value, and the degree of horizontality of the same 88, 14 is increased.

While the present invention has been described in its preferred embodiments, it is to be understood that the invention may be embodied with other changes, improvements, and modifications that may occur to the person skilled in the art without departing from the scope and spirit of the invention defined in the appended claims.

What is claimed is:

1. An electric-component mounter for mounting a plurality of electric components on a circuit substrate, the mounter comprising:

a substrate supporting device which supports the circuit substrate;

an electric-component supplying device which supplies a plurality of electric components to be mounted on the circuit substrate;

a mounting device which receives the electric components from the electric-component supplying device and mounts the electric components on the circuit substrate supported by the substrate supporting device;

a base member which supports the substrate supporting device, the electric-component supplying device, and the mounting device;

at least one elastic member which is provided between the base member and a surface of a floor which supports the base member; and at least one damper which damps vibration of the base member and the floor surface relative to each other, the vibration resulting from elastic deformation of the elastic member.

2. A mounter according to claim 1, further comprising:

at least one upper member which is fixed to the base member; and at least one lower member which is provided on the floor surface, the elastic member and the damper being provided between the upper and lower members.

3. A mounter according to claim 1, comprising:

a plurality of said elastic members each of which is provided between the base member and the floor surface;

a plurality of said dampers each of which damps the vibration of the base member and the floor surface relative to each other;

a plurality of upper members each of which is fixed to the base member; and a plurality of lower members each of which is provided on the floor surface, at least one first elastic member of said plurality of elastic members and at least one first damper of said plurality of dampers being provided between at least one first upper member of said plurality of upper members and at least one first lower member of said plurality of lower members, so as to provide a first supporting unit, at least one second elastic member of said plurality of elastic members and at least one second damper of said plurality of dampers being provided between at least one second upper member of said plurality of upper members and at least one second lower member of said plurality of lower members, so as to provide a second supporting unit, the first and second supporting units cooperating with each other to support the base member, at respective locations which are distant from each other in a horizontal direction.

4. A mounter according to claim 3, wherein the electric-component supplying device comprises a component-supply table and a plurality of component supplying units which are provided on the component-supply table such that respective component-supply portions of the component supplying units are arranged along a straight line, and wherein the apparatus further comprises an inclination adjusting device which is provided between the floor surface and a portion of the base member that supports the component-supply table, and which adjusts an inclination of the base member relative to the floor surface.

5. A mounter according to claim 4, wherein the mounting device receives the electric components from the electric-component supplying device, at a predetermined component-receiving position through which the straight line along which the respective component-supply portions of the component supplying units are arranged passes, and the electric-component supplying device comprises a movable electric-component supplying device which comprises the component-supply table comprising a movable table which is movable along the straight line, and the component supplying units having the respective component-supply portions each of which is selectively positioned at the component-receive position by the movement of the movable table, and wherein the first and second supporting units are provided at the respective locations which are distant from each other in the horizontal direction parallel to the straight line, and each of the first and second dampers of the first and second supporting units has a function of damping the relative vibration of the base member and the floor surface in all directions on at least a vertical plane parallel to the straight line.

6. A mounter according to claim 3, wherein said at least one first upper member comprises an elongate first upper member, said at least one first lower member comprises an elongate first lower member, said at least one second upper member comprises an elongate second upper member, and said at least one second lower member comprises an elongate second lower member, and wherein the first supporting unit comprises two said first elastic members one of which is provided at one of lengthwise opposite end portions of the elongate first upper member and one of lengthwise opposite end portions of the elongate first lower member and the other of which is provided at the respective other end portions of the elongate first upper and lower members, and two said first dampers one of which is provided at the respective one end portions of the elongate first upper and lower members, and the other of which is provided at the respective other end portions of the elongate first upper and lower members, and the second supporting unit comprises two said second elastic members one of which is provided at one of lengthwise opposite end portions of the elongate second upper member and one of lengthwise opposite end portions of the elongate second lower member and the other of which is provided at the respective other end portions of the elongate second upper and lower members, and two said second dampers one of which is provided at the respective one end portions of the elongate second upper and lower members and the other of which is provided at the respective other end portions of the elongate second upper and lower members.

7. A mounter according to claim 1, wherein the mounting device receives, at a predetermined component-receive position, the electric components from the electric-component supplying device, and the electric-component supplying device comprises a movable electric-component supplying device which includes a movable table which is movable along a straight line passing through the component-receive position; and a plurality of component supplying units which are provided on the movable table and each of which is selectively positioned at the component-receive position by the movement of the movable table, and wherein the damper damps the relative vibration of the base member and the floor surface in at least a direction parallel to the straight line along which the movable table on which the component supplying units are provided is movable.

8. A mounter according to claim 7, wherein the damper damps the relative vibration of the base member and the floor surface in all directions on at least a vertical plane parallel to the straight line along which the movable table on which the component supplying units are provided is movable.

9. A mounter according to claim 1, wherein the damper comprises an adjustable damper which has an adjustable vibration damping characteristic.

10. A mounter according to claim 9, wherein the adjustable damper comprises:

a movable member which is movable as a unit with the base member;

a stationary member which is substantially immovable relative to the floor surface;

a friction member which is held by one of the movable and stationary members such that the friction member is movable toward, and away from, the other of the movable and stationary members and is frictionally contactable with said other of the movable and stationary members; and a pressing device which is provided between the friction member and said one of the movable and stationary members and which presses, with an adjustable pressing force, the friction member against said other of the movable and stationary members.

11. A mounter according to claim 10, wherein the pressing device comprises a fluid-pressure-operated cylinder which includes a cylinder and a piston and which is fixed to said one of the movable and stationary members, the piston pressing the friction member against said other of the movable and stationary members.

12. A mounter according to claim 1, wherein the damper comprises an unadjustable damper which has an unadjustable vibration damping characteristic.

13. A mounter according to claim 1, further comprising at least one inclination adjusting device which is provided between the base member and the floor surface and which adjusts an inclination of the base member relative to the floor surface.

14. A mounter according to claim 13, wherein the inclination adjusting device comprises:

a gas spring which comprises a gas chamber and a compressible gas enclosed in the gas chamber; and a leveling valve device which adjusts a pressure of the compressible gas enclosed in the gas chamber of the gas spring and thereby adjusts the inclination of the base member relative to the floor surface.

15. A mounter according to claim 14, wherein the leveling device comprises a mechanical valve device which is provided between the base member and the floor surface and which adjusts the inclination of the base member relative to the floor surface, based on movement of the base member and the floor surface relative to each other in a direction intersecting a horizontal plane.

16. A mounter according to claim 1, wherein the mounter comprises a plurality of said elastic members each of which is provided between the base member and the floor surface.

17. A mounter according to claim 16, wherein the base member comprises a substantially rectangular base member, and wherein the mounter comprises at least four elastic members which are provided, between the rectangular base member and the floor surface, at respective positions corresponding to four corners of the rectangular base member.

* * * * *